US012701870B2

(12) United States Patent
Lee et al.

(10) Patent No.: US 12,701,870 B2
(45) Date of Patent: Aug. 4, 2026

(54) DISPLAY DEVICE

(71) Applicant: Samsung Display Co., Ltd., Yongin-si (KR)

(72) Inventors: Seon Uk Lee, Yongin-si (KR); Gyeongeun Eoh, Yongin-si (KR); Kwang-Min Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 456 days.

(21) Appl. No.: 18/503,269

(22) Filed: Nov. 7, 2023

(65) Prior Publication Data

US 2024/0251604 A1      Jul. 25, 2024

(30) Foreign Application Priority Data

Jan. 25, 2023      (KR) ......................... 10-2023-0009294

(51) Int. Cl.
| | |
|---|---|
| *H10K 59/122* | (2023.01) |
| *H10K 59/12* | (2023.01) |
| *H10K 59/38* | (2023.01) |
| *H10K 71/13* | (2023.01) |

(52) U.S. Cl.
CPC ....... *H10K 59/122* (2023.02); *H10K 59/1201* (2023.02); *H10K 59/38* (2023.02); *H10K 71/135* (2023.02)

(58) Field of Classification Search
CPC .. H10K 59/122; H10K 59/1201; H10K 59/38; H10K 71/135
See application file for complete search history.

(56) References Cited

U.S. PATENT DOCUMENTS

| | | | | |
|---|---|---|---|---|
| 11,114,512 | B2 * | 9/2021 | Lee ......................... | H10K 59/38 |
| 11,163,195 | B2 | 11/2021 | Lee et al. | |
| 11,469,287 | B2 | 10/2022 | Lee et al. | |
| 12,041,830 | B2 * | 7/2024 | Kim ..................... | H10D 86/443 |
| 2008/0036367 | A1 | 2/2008 | Eida et al. | |
| 2021/0020721 | A1 * | 1/2021 | Kwack ................. | H10K 59/126 |
| 2021/0328168 | A1 | 10/2021 | Park et al. | |
| 2022/0293685 | A1 | 9/2022 | Lee et al. | |
| 2023/0363211 | A1 * | 11/2023 | Jung ..................... | G06F 3/0412 |

FOREIGN PATENT DOCUMENTS

| | | |
|---|---|---|
| KR | 10-2007-0049172 | 5/2007 |
| KR | 10-2020-0140966 | 12/2020 |
| KR | 10-2223421 | 3/2021 |
| KR | 10-2021-0129786 | 10/2021 |
| KR | 10-2022-0126856 | 9/2022 |

* cited by examiner

*Primary Examiner* — Anne M Hines

(74) *Attorney, Agent, or Firm* — CANTOR COLBURN LLP

(57) ABSTRACT

A display device may include a display panel, a first light conversion layer, a second light conversion layer, and a light transmission layer that are disposed on the display panel and spaced apart from each other, a support layer that is disposed between the first light conversion layer and the second light conversion layer; and a bank layer that is disposed on the display panel to define openings in which the first and second light conversion layers are disposed, and is disposed on the support layer and between the first and second light conversion layers. The support layer and the light transmission layer may include a same material.

21 Claims, 20 Drawing Sheets

FIG. 12A

DISPLAY DEVICE

CROSS-REFERENCE TO RELATED APPLICATION(S)

This U.S. non-provisional patent application claims priority to and benefits of Korean Patent Application No. 10-2023-0009294 under 35 U.S.C. § 119, filed on Jan. 25, 2023 in the Korean Intellectual Property Office, the entire contents of which are incorporated herein by reference.

BACKGROUND

1. Technical Field

The disclosure relates to a display device.

2. Description of the Related Art

Multimedia display devices such as televisions, mobile phones, tablets, computers, navigation devices, and game machines may include display panels for displaying images. Such a display panel may include multiple pixels for displaying an image, and each of the pixels may include a light emitting element generating light and a driving element connected to the light emitting element.

Recently, display devices including light conversion layers and a light transmission layer have been developed to improve color purity. The light conversion layers and the light transmission layer may be disposed on the pixels, and the light conversion layers may convert light generated from pixels into light having a different wavelength. The light transmission layer may transmit light generated by the pixels. Each of the light conversion layers and the light transmission layer may be disposed to overlap a corresponding one of the pixels. Each of the light conversion layers may include quantum dots and a resin for converting a wavelength of light. The light transmission layer may include a scatterer and a resin.

The scatterer, quantum dots, and resin may be provided in openings defined in the light conversion layers and the light transmission layer using an inkjet process. However, as resolution increases, a size of the opening may decrease. In particular, in the case of the light transmission layer, because the size of the opening becomes small, it may not be easy to provide the scatterer and the resin. To this end, the resin and the scatterer of the light transmission layer may be provided using a photoresist technique. Accordingly, production of the display panel may be facilitated.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An aspect of the disclosure is to provide a display device having an improved color matching rate by supporting a bank layer with a support layer and a light transmission layer.

A display device according to some embodiments may include a display panel, a first light conversion layer, a second light conversion layer, and a light transmission layer that are disposed on the display panel and spaced apart from each other, a support layer that is disposed between the first light conversion layer and the second light conversion layer, and a bank layer that is disposed on the display panel to define openings in which the first and second light conversion layers are disposed, and is disposed on the support layer between the first and second light conversion layers. The support layer and the light transmission layer may include a same material.

The bank layer may cover an edge of the light transmission layer. The bank layer may expose a portion of the light transmission layer spaced apart from the edge of the light transmission layer.

The bank layer may include a first bank layer that is disposed on the support layer between the first and second light conversion layers, and a plurality of second bank layers that are disposed between the first light conversion layer and the light transmission layer and between the second light conversion layer and the light transmission layer, the plurality of second bank layers covering an edge of the light transmission layer.

The first bank layer may be disposed on the display panel to cover the support layer.

The first bank layer may be disposed on an upper surface of the support layer and on a side surface of the support layer facing the first and second light conversion layers. Another side surface of the support layer on which the first bank layer is not disposed may be exposed by the first bank layer.

The support layer may include a first support layer, and a second support layer that is spaced apart from the first support layer. The first bank layer may be disposed between the first support layer and the second support layer and on upper surfaces of the first and second support layers. A side surface of the first support layer and a side surface of the second support layer that do not face each other may be exposed by the first bank layer.

The first bank layer and the plurality of second bank layers may have a black color.

The display device may further include a spacer that is disposed on the light transmission layer and spaced apart from the plurality of second bank layers.

An upper surface of the spacer may be disposed at a different height from upper surfaces of the plurality of second bank layers.

The upper surface of the spacer may be closer to the display panel than the upper surfaces of the plurality of second bank layers.

The upper surface of the spacer may be further spaced from the display panel than the upper surfaces of the plurality of second bank layers.

The spacer may have a black color.

The display panel may include a plurality of light emitting elements that are disposed in light emitting regions, and a pixel defining layer that is disposed in a non-light emitting region between the light emitting regions and defines light emitting openings in which the plurality of light emitting elements are disposed overlapping the light emitting regions in a plan view. The first and second light conversion layers may overlap the light emitting regions in a plan view. The light transmission layer may overlap the light emitting regions and the non-light emitting region in a plan view.

The first bank layer, the plurality of second bank layers, and the spacer may overlap the non-light emitting region in a plan view.

The display device may further include a first color filter that is disposed on the first light conversion layer, a second color filter that is disposed on the second light conversion layer, and a third color filter that is disposed on the light transmission layer.

The first, second, and third color filters may extend onto the first bank layer and the plurality of second bank layers and may overlap each other in a plan view.

A method of manufacturing a display device according to some embodiments may include providing a light transmission layer and a support layer spaced apart from the light transmission layer on a substrate, providing a bank layer on the support layer and on an edge of the light transmission layer, providing a first light conversion layer and a second light conversion layer in openings defined by the bank layer around the support layer and the light transmission layer, and providing the first and second light conversion layers and the light transmission layer on a display panel to face the display panel. The support layer and the light transmitting layer may include a same material.

The light transmission layer and the support layer may be simultaneously patterned. The light transmission layer and the support layer may be formed of a same material.

The providing of the first and second light conversion layers may include forming the first and second light conversion layers using an inkjet process.

The bank layer may include a first bank layer that is disposed on the support layer between the first and second light conversion layers, and a plurality of second bank layers that are disposed between the first light conversion layer and the light transmission layer and between the second light conversion layer and the light transmission layer and that cover an edge of the light transmission layer. The first bank layer may be disposed on the display panel to cover upper and side surfaces of the support layer.

A display device according to some embodiments may include a display panel, a first light conversion layer, a second light conversion layer, and a light transmission layer that are disposed on the display panel and spaced apart from each other, a support layer that is disposed between the first light conversion layer and the second light conversion layer, a bank layer that is disposed on the light transmission layer, covers an edge of the light transmission layer and the support layer, and defines openings in which the first and second light conversion layers are disposed, and a spacer that is disposed on the light transmission layer and spaced apart from the bank layer. The support layer and the light transmission layer may include a same material. The bank layer and the spacer may include a same material. The bank layer and the spacer may not overlap each other in a plan view.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 12A to 12I are schematic views illustrating a process for forming a light control layer shown in FIG. 7.

DETAILED DESCRIPTION OF THE EMBODIMENTS

Figure 1:
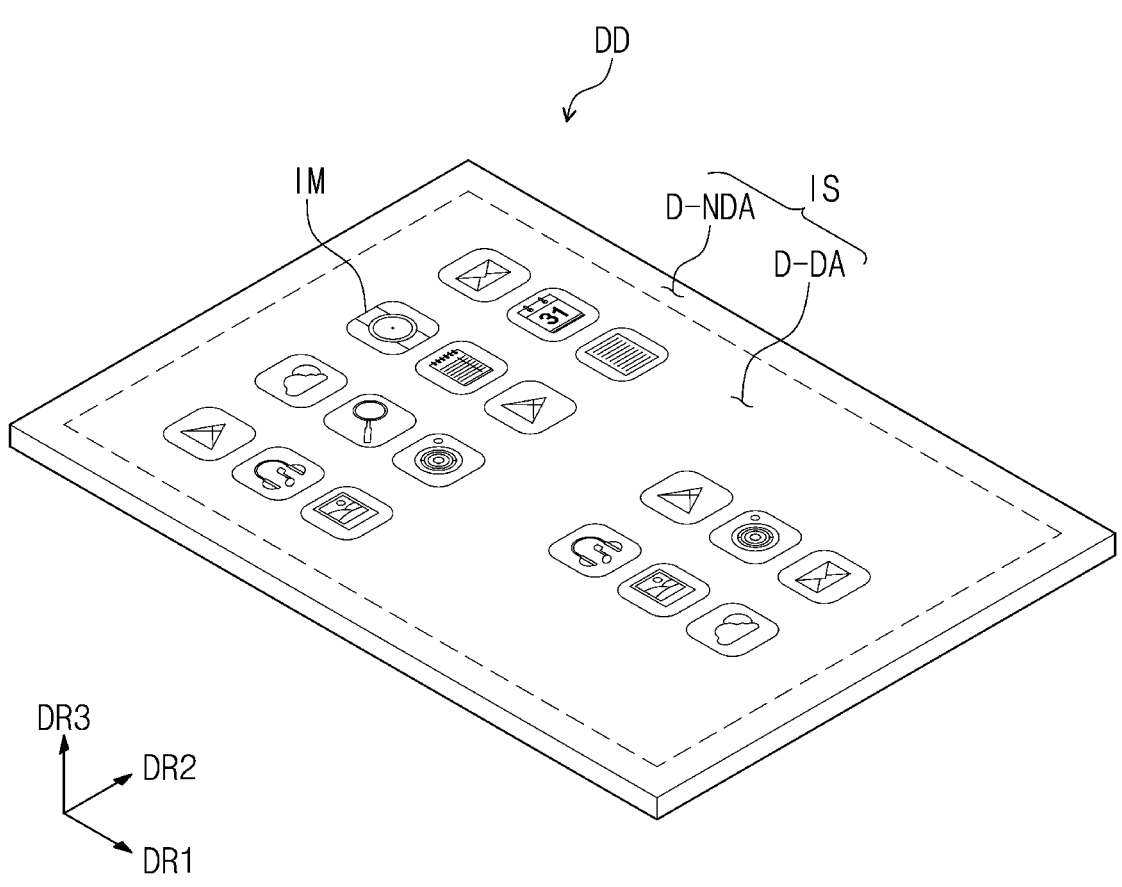
FIG. 1 is a schematic perspective view of a display device according to the disclosure.

The advantages and features of the disclosure and the manner of achieving the same will become apparent from the embodiments described in detail below with reference to the accompanying drawings. The disclosure may however, be embodied in many different forms and should not be construed as limited to the embodiments set forth herein. It should be understood that these embodiments are provided such that the disclosure will be thorough and complete, and will fully convey the concept of the disclosure to those skilled in the art. Wherever possible, the same reference numerals will be used to refer to the same or like parts.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Where an element or a layer is referred to as being "on" another element or another layer, it may be directly on the other element or the other element, or intervening elements or layers may be present. In contrast, the term "directly" may mean that there are no intervening elements or layers.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. Like reference numerals refer to like elements throughout.

It will be understood that, although the terms "first," "second," and the like may be used herein to describe various elements, components, and/or sections, these elements, components, and/or sections should not be limited by these terms. These terms are only used to distinguish one element, component, or section from another element, component, or section. Thus, "a first element (a first component, or a first section)" discussed below could be termed "a second element (a second component, or a second section)" without departing from the teachings herein.

The term "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

Embodiments described herein will be described referring to plan views and/or cross-sectional views by way of schematic views. Accordingly, the views may be modified depending on manufacturing technologies and/or tolerances. Therefore, the disclosed embodiments are not limited to those shown in the views, but include modifications in configuration formed on the basis of manufacturing processes. Therefore, regions in figures have schematic properties, and shapes of regions shown in figures are only examples of specific shapes of regions of elements, and the specific properties and shapes do not limit aspects of the disclosure.

"About" or "approximately" or "substantially" as used herein is inclusive of the stated value and may mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
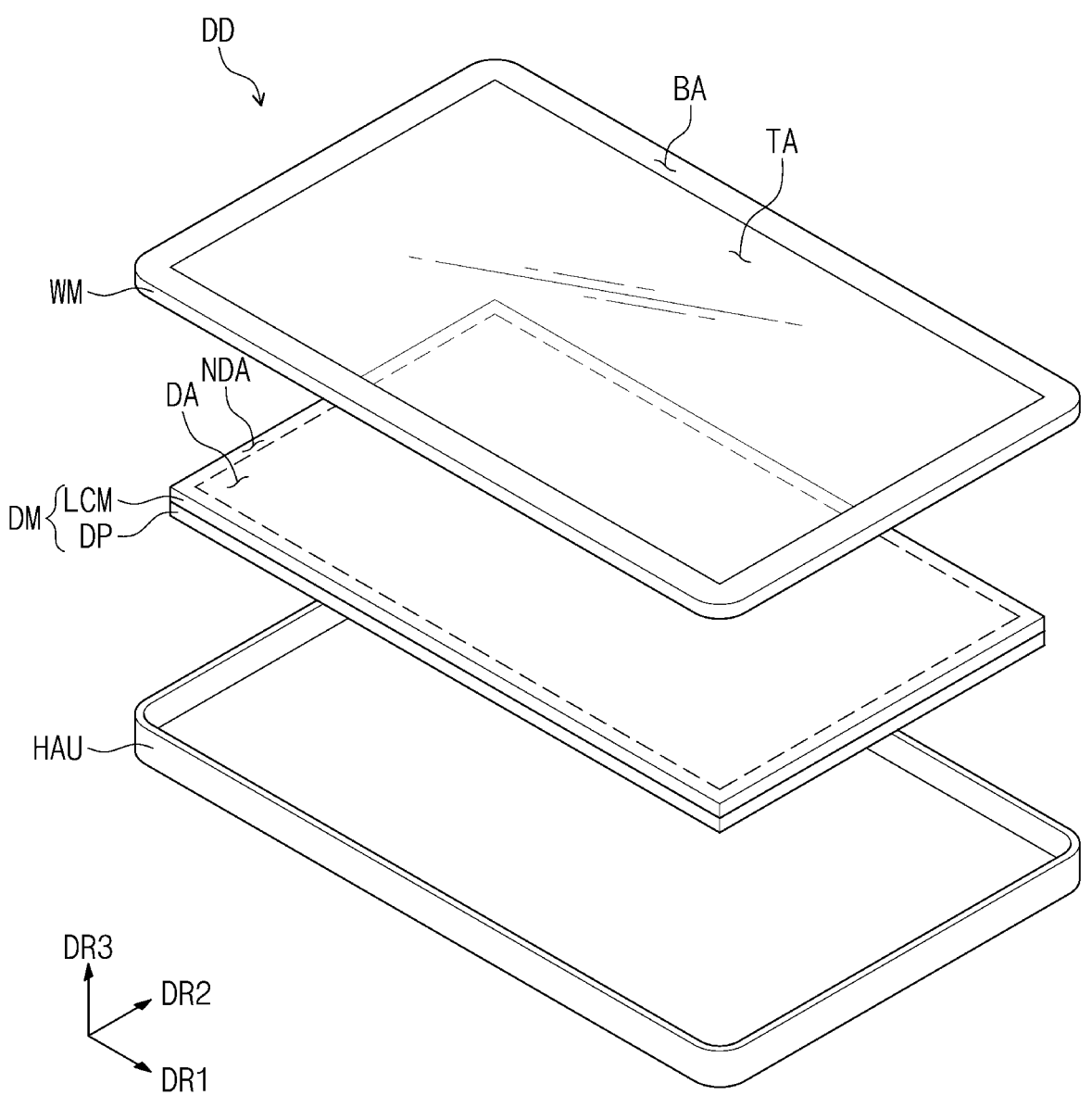
FIG. 2 is an exploded schematic perspective view of the display device shown in FIG. 1.

FIG. 1 is a schematic perspective view of a display device according to the disclosure. FIG. 2 is an exploded schematic perspective view of the display device shown in FIG. 1.

Referring to FIG. 1, a display device DD may have a rectangular shape having long sides extending in a first direction DR1 and short sides extending in a second direction DR2 in a plan view. However, the display device DD is not limited thereto and may have various shapes such as a circular shape and a polygonal shape.

Hereinafter, a direction substantially perpendicular to a plane defined by the first and second directions DR1 and DR2 is defined as a third direction DR3. In this specification, "when viewed in a plan view" may mean a state viewed from the third direction DR3.

An upper surface of the display device DD may be defined as a display surface IS and may have a plane defined by the first and second directions DR1 and DR2. Images IM generated by the display device DD may be provided to a user through the display surface IS.

The display surface IS may include a display part D-DA and a non-display part D-NDA around the display part D-DA. The display part D-DA may display an image, and the non-display part D-NDA may not display an image. The non-display part D-NDA may surround the display part D-DA and define an edge of the display device DD printed in a certain color.

The display device DD may be used in large electronic devices such as televisions, monitors, or external billboards. Also, the display device DD may be used in small and medium-sized electronic devices such as a personal computer, a notebook computer, a personal digital terminal, a car navigation system, a game console, a smart phone, a tablet, or a camera. However, these are presented only as example embodiments, and may be used for other electronic devices as long as they do not deviate from the disclosure.

Referring to FIG. 2, the display device DD may include a window WM, a display module DM, and an external case HAU. The display module DM may include a display panel DP and a light control member LCM disposed on the display panel DP.

The window WM and the outer case HAU may be assembled to configure an exterior of the display device DD, and provide an internal space capable of accommodating elements of the display device DD, such as the display module DM.

The window WM may be disposed on the display module DM. The window WM may protect the display module DM from external impact. A front surface of the window WM may correspond to the display surface (IS, see FIG. 1) of the display device DD described above. The front surface of the window WM may include a transmission area TA and a bezel area BA.

The transmission area TA of the window WM may be an optically transparent area. The transmission area TA of the window WM may transmit an image provided by the display module DM, and a user may view a corresponding image. The transmission area TA may correspond to the display part D-DA (refer to FIG. 1) of the display device DD.

The window WM may include an optically transparent insulating material. For example, the window WM may include glass, sapphire, and/or plastic. The window WM may have a single-layer or multi-layer structure. The window WM may further include functional layers such as an anti-fingerprint layer, a phase control layer, and/or a hard coating layer disposed on the optically transparent substrate.

The bezel area BA of the window WM may be an area provided by depositing, coating, or printing a material having a certain color on a transparent substrate. The bezel area BA of the window WM may prevent a component of the display module DM disposed overlapping the bezel area BA from being viewed to the outside. The bezel area BA may correspond to the non-display part D-NDA (see FIG. 1) of the display device DD.

The display module DM may be disposed between the window WM and the outer case HAU. The display module DM may display an image according to an electrical signal.

The display module DM may include a display area DA and a non-display area NDA adjacent to the display area DA.

The display area DA may be an area activated in response to an electrical signal. The display area DA may be an area where an image provided by the display panel DP is emitted. The display area DA of the display module DM may overlap at least a portion of the transmission area TA. An image output from the display area DA may be viewed from the outside through the transmission area TA.

The non-display area NDA may be adjacent to the display area DA. For example, the non-display area NDA may surround the display area DA. However, the non-display area NDA is not limited thereto, and the non-display area NDA may be defined in various shapes. The non-display area NDA may be an area where driving circuits or driving wirings for driving elements disposed in the display area DA, various signal lines providing electrical signals to the elements, and pads are disposed. The non-display area NDA may overlap at least a portion of the bezel area BA, and components of the display module DM disposed in the non-display area NDA may be prevented from being visible to the outside through the bezel area BA.

The display panel DP according to an embodiment may be a light emitting display panel, and is not particularly limited thereto. For example, the display panel DP may be an organic light emitting display panel, an inorganic light emitting display panel, or a quantum dot light emitting display panel. A light emitting layer of the organic light emitting display panel may include an organic light emitting material, and a light emitting layer of the inorganic light emitting display panel may include an inorganic light emitting material. A light emitting layer of the quantum dot light emitting display panel may include quantum dots and/or quantum rods. Hereinafter, in this embodiment, the display panel DP will be described as an organic light emitting display panel.

The light control member LCM may be disposed on the display panel DP. After the light control member LCM is manufactured through a separate process, it may be provided on the display panel DP and assembled with the display panel DP through a bonding process. The light control member LCM is not limited thereto, and the light control member LCM may be formed on the display panel DP through a continuous process.

The light control member LCM may selectively transmit light provided by the display panel DP or selectively convert a wavelength of light. The light control member LCM may prevent reflection of external light incident from the outside of the display device DD.

The outer case HAU may be disposed under the display module DM to accommodate the display module DM. The outer case HAU may include a material with relatively high rigidity. The outer case HAU may protect the display module DM by absorbing shock applied to the display module DM from the outside and preventing foreign substances and/or moisture from penetrating into the display module DM. The outer case HAU according to an embodiment may be provided in a form in which multiple accommodating members are combined.

The display device DD may further include an input sensing module that obtains coordinate information of an external input applied from the outside of the display device DD. The input sensing module of the display device DD may be driven in various ways, such as a capacitive type, a resistive type, an infrared type, or a pressure type, but is not limited thereto.

In an embodiment, the input sensing module may be disposed on the display module DM. The input sensing module may be directly disposed on the display module DM through a continuous process, or may be manufactured separately from the display module DM and combined to the display module DM by an adhesive layer. In an embodiment, the input sensing module may be disposed between components of the display module DM. For example, the input sensing module may be disposed between the display panel DP and the light control member LCM.

Figure 3:
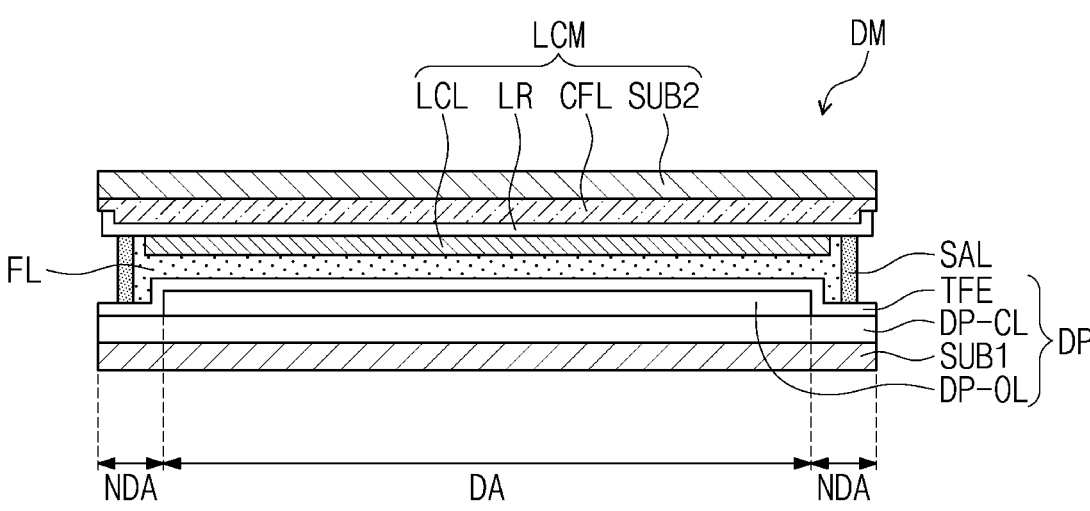
FIG. 3 is a schematic cross-sectional view of a display module shown in FIG. 2.
Figure 3:
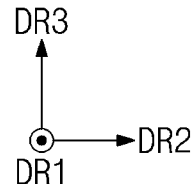

FIG. 3 is a schematic cross-sectional view of a display module shown in FIG. 2.

A display panel DP and a light control member LCM of FIG. 3 may be the same as those of the display panel DP and the light control member LCM of FIG. 2, and thus redundant descriptions will be omitted.

Referring to FIG. 3, a display module DM may include a display panel DP, a light control member LCM, and a sealing member SAL and filling member FL disposed between the display panel DP and the light control member LCM.

The display panel DP may include a lower substrate SUB1, a circuit layer DP-CL, a display element layer DP-OL, and an encapsulation layer TFE.

The lower substrate SUB1 may include a glass substrate, a polymer substrate, and/or an organic/inorganic composite material substrate. The lower substrate SUB1 may include upper and lower surfaces parallel to first and second directions DR1 and DR2, respectively. The lower substrate SUB1 may include a display area DA and a non-display area NDA, and may provide a base surface on which components of the display panel DP are stacked on each other. The circuit layer DP-CL, the light emitting element layer DP-OL, and the encapsulation layer TFE may be sequentially stacked on each other and formed on the upper surface of the lower substrate SUB1 in a third direction DR3.

The display element layer DP-OL may include light emitting elements disposed in the display area DA. The circuit layer DP-CL may be disposed between the display element layer DP-OL and the lower substrate SUB1 and may include driving elements, signal lines, and pads connected to the light emitting elements. The light emitting elements of the display element layer DP-OL may provide source light (or first light) toward the light control member LCM in the display area DA.

The encapsulation layer TFE may be disposed on the display element layer DP-OL to seal the light emitting elements. The encapsulation layer TFE may include multiple thin layers. The thin layers of the encapsulation layer TFE may be disposed to improve optical efficiency of the light emitting element or to protect the light emitting element.

The light control member LCM may include an upper substrate SUB2, a color filter layer CFL, a low refractive index layer LR, and a light control layer LCL. The upper substrate SUB2 may include a front surface and a rear surface parallel to the first and second directions DR1 and DR2, respectively. The rear surface of the upper substrate SUB2 may face an upper surface of the lower substrate SUB1. The upper substrate SUB2 may provide a base surface on which components of the light control member LCM are stacked on each other. The color filter layer CFL, low refractive index layer LR, and light control layer LCL may be sequentially stacked on each other and formed on the rear surface of the upper substrate SUB2 in the third direction DR3.

The light control layer LCL may include a light transmission layer and a light conversion layer disposed to overlap the display area DA. The light control layer LCL may extend from the display area DA and overlap the non-display area NDA. The light conversion layer of the light control layer LCL may convert a wavelength of source light provided by the light emitting element. The light transmission layer of the light control layer LCL may transmit the source light. The light conversion layer and the light transmission layer will be described in detail in FIG. 7.

The color filter layer CFL may be disposed to overlap the display area DA, and may filter light transmitted through the light control layer LCL. The color filter layer CFL may include color filters displaying the same color as the pixel. The color filter layer CFL may absorb light passing through without being converted by the light control layer LCL, and prevent color purity of the display device DD (refer to FIG. 1) from deteriorating. The color filter layer CFL may filter external light into the same colors as the pixels and may reduce external light reflectance of the display device DD (refer to FIG. 1).

The color filter layer CFL may extend from the display area DA and overlap the non-display area NDA. The color filter layer CFL may include color filters overlapping each other in the non-display area NDA, and may absorb light emitted or reflected through the non-display area NDA.

The sealing member SAL may be disposed between the display panel DP and the light control member LCM to couple the display panel DP and the light control member LCM. The sealing member SAL may overlap the non-display area NDA. The display panel DP and the light control member LCM may be formed through separate processes, and the display module DM may be manufactured by combining the display panel DP and the light control member LCM using the sealing member SAL. The sealing member SAL may include an ultraviolet curable material, but the material of the sealing member SAL is not limited thereto.

The filling member FL may be disposed between the display panel DP and the light control member LCM to fill an empty space between the display panel DP and the light control member LCM overlapping the display area DA. In an embodiment, the filling member FL may be disposed between the encapsulation layer TFE and the light control layer LCL. The filling member FL may include a silicone, epoxy, and/or acrylic-based thermosetting material. However, the material of the filling member FL is not limited thereto.

In the display module DM according to an embodiment, the light control member LCM may be directly disposed on the display panel DP. The light control member LCM may be formed on an upper surface of the encapsulation layer TFE of the display panel DP through a continuous process. The sealing member SAL and the filling member FL may be omitted. This will be explained in detail in FIGS. 10 and 11.

Figure 4:
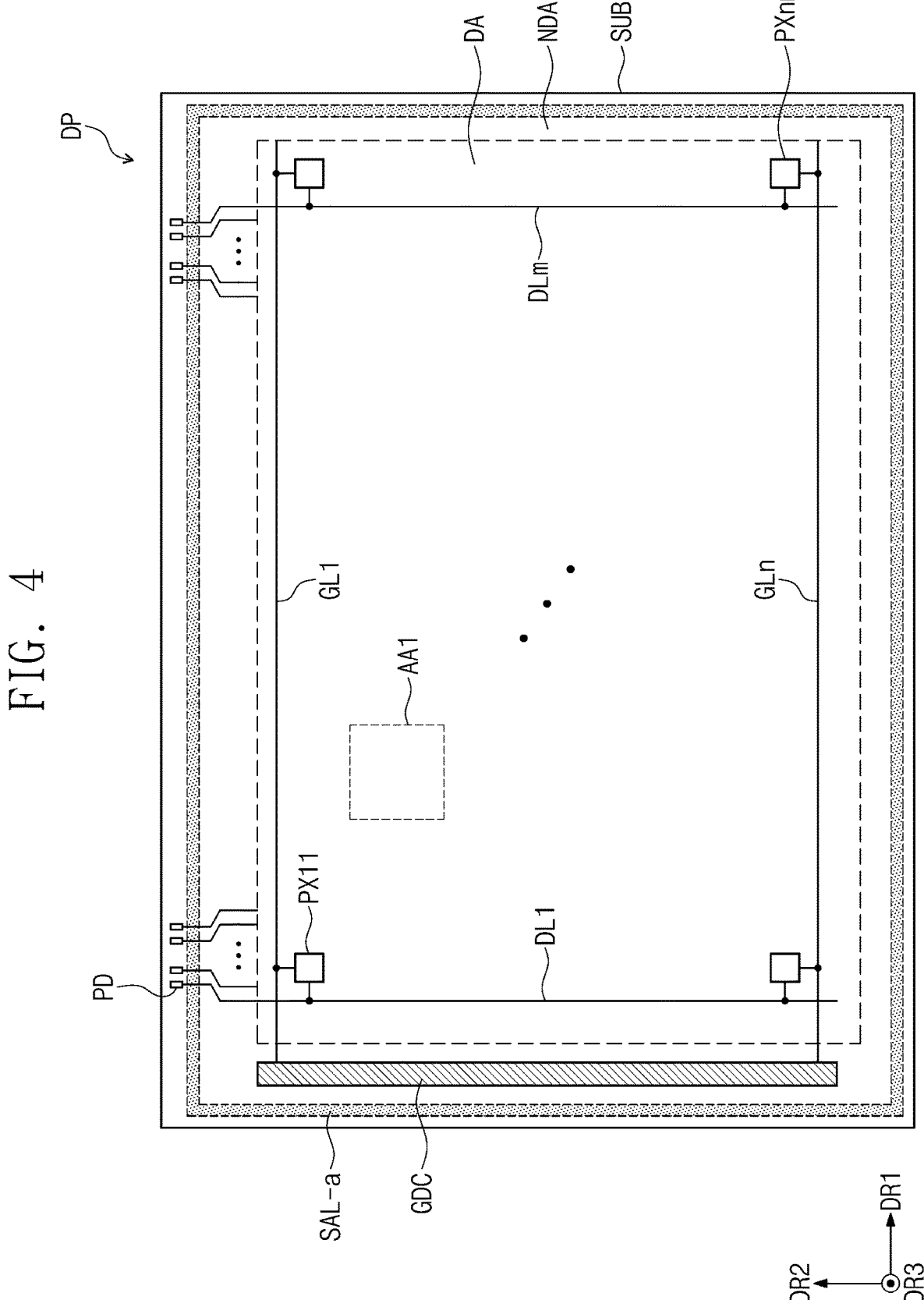
FIG. 4 is a schematic plan view of a display panel shown in FIG. 2.

FIG. 4 is a schematic plan view of a display panel shown in FIG. 2.

Referring to FIG. 4, a lower substrate SUB1 of a display panel DP may include a display area DA and a non-display area NDA. The display panel DP may include pixels PX11 to PXnm, signal lines GL1 to GLn and DL1 to DLm electrically connected to the pixels PX11 to PXnm, a driving circuit GDC, and pads PD.

Each of the pixels PX11 to PXnm may include a light emitting element to be described later and a pixel driving circuit including multiple transistors (e.g., a switching transistor, a driving transistor, etc.) connected to the light emitting element. The pixels PX11 to PXnm may emit light in response to electrical signals applied to the pixels PX11 to PXnm.

The pixels PX11 to PXnm may be disposed in the display area DA. Embodiments are not limited thereto, and transistors constituting some of the pixels PX11 to PXnm may be disposed in the non-display area NDA. Although FIG. 4 illustrates the pixels PX11 to PXnm arranged in a matrix form, an arrangement of the pixels PX11 to PXnm is not limited thereto.

The signal lines GL1 to GLn and DL1 to DLm may include gate lines GL1 to GLn and data lines DL1 to DLm. Each of the pixels PX11 to PXnm may be connected to a corresponding gate line among the gate lines GL1 to GLn and a corresponding data line among the data lines DL1 to DLm. Depending on a configuration of the pixel driving circuit of the pixels PX11 to PXnm, more types of signal lines may be provided on the display substrate DP.

The driving circuit GDC may be disposed in the non-display area NDA. However, the driving circuit GDC is not limited thereto, and some of the components of the driving circuit GDC may be disposed in the display area DA, thereby minimizing the area of the non-display area NDA. The driving circuit GDC may include a gate driving circuit. The gate driving circuit may generate gate signals and sequentially output the gate signals to the gate lines GL1 to GLn. The gate driving circuit may further output another control signal to the pixel driving circuits of the pixels PX11 to PXnm.

The pads PD may be disposed in a direction on the non-display area NDA. The pads PD may be parts connected to a circuit board. Each of the pads PD may be connected to a corresponding signal line among the signal lines GL1 to GLn and DL1 to DLm, and may be connected to a corresponding pixel through the signal line. The pads PD may have an integral shape with the signal lines GL1 to GLn and DL1 to DLm. However, embodiments are not limited thereto, and the pads PD may be disposed on a different layer from the signal lines GL1 to GLn and DL1 to DLm and connected through contact holes.

FIG. 4 illustrates a sealing member placement area SAL-a corresponding to an area in which the sealing member SAL (see FIG. 3) is disposed. The sealing member placement area SAL-a may correspond to a portion of the non-display area NDA. The sealing member placement area SAL-a may be adjacent to the edge of the display panel DP and may extend in an extending direction of the edge. The sealing member placement area SAL-a may surround the display area DA in plan view. In an embodiment, the sealing member placement area SAL-a may be positioned outside an area where the driving circuit GDC is disposed.

Figure 5:
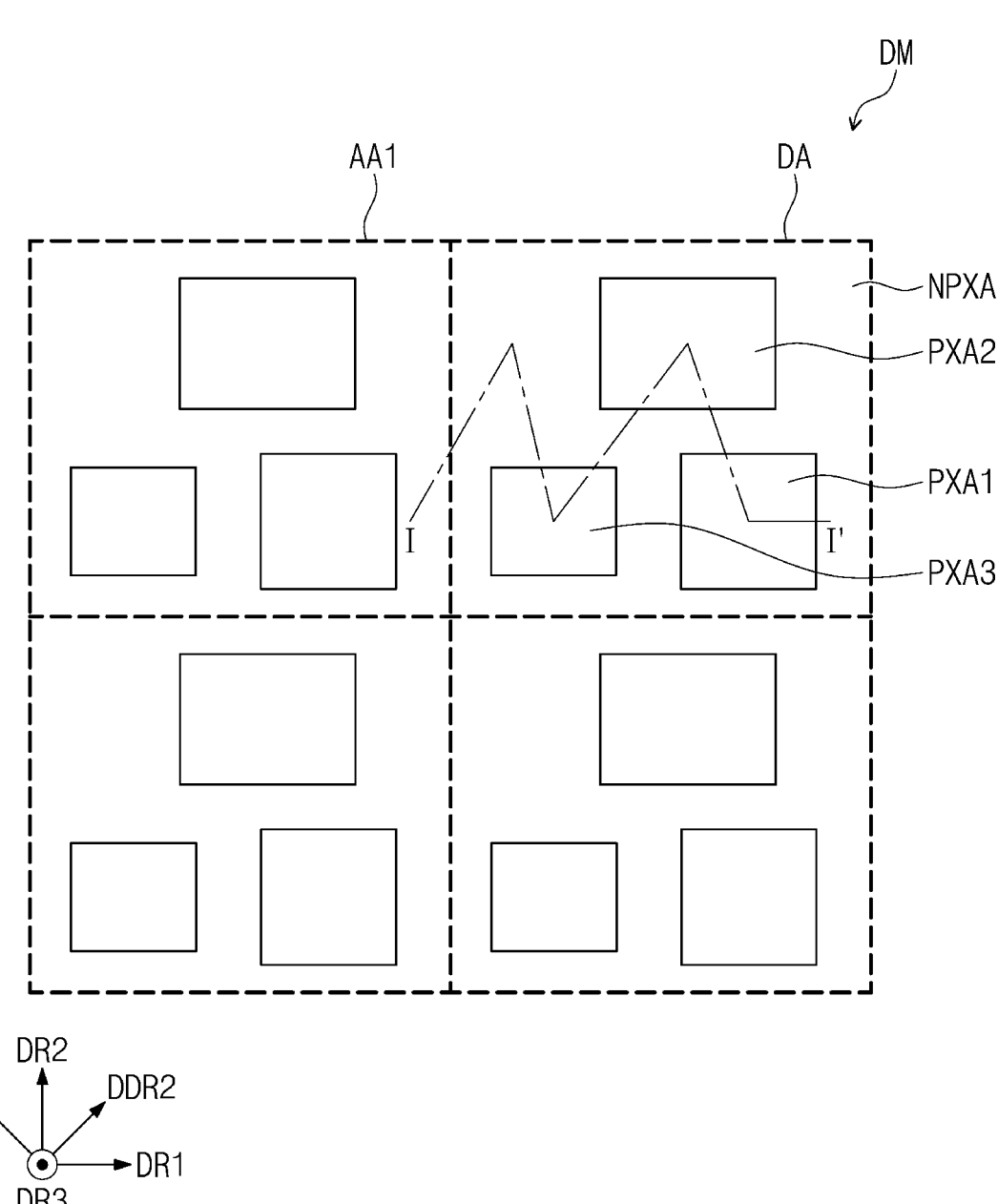
FIG. 5 is an enlarged schematic plan view of a first region AA1 of FIG. 4.

FIG. 5 is an enlarged schematic plan view of region 'AA1' of FIG. 4.

For example, FIG. 5 is an enlarged view of a portion corresponding to the display area DA of FIG. 4.

Referring to FIG. 5, the display area DA may include light emitting regions PXA1, PXA2, and PXA3 corresponding to light emitting elements and a non-light emitting region NPXA surrounding the light emitting regions PXA1, PXA2, and PXA3.

Each of the light emitting regions may include a first light emitting region PXA1, a second light emitting region PXA2, and a third light emitting region PXA3. Hereinafter, one first light emitting region PXA1, one second light emitting region PXA2, and one third light emitting region PXA3 of the first light emitting regions PXA1, the second light emitting regions PXA2, and the third light emitting regions PXA3 will be described. The first light emitting region PXA1 may emit red light, the second light emitting region PXA2 may emit green light, and the third light emitting region PXA3 may emit blue light.

For example, the first light emitting region PXA1 and the third light emitting region PXA3 may be arranged in the first direction DR1. For example, the first light emitting region PXA1 and the second light emitting region PXA2 may be arranged in a first diagonal direction DDR1. For example, the second light emitting region PXA2 and the third light emitting region PXA3 may be arranged in a second diagonal direction DDR2. The first diagonal direction DDR1 may be defined as a direction crossing (intersecting) the first and second directions DR1 and DR2 on a plane defined by the first and second directions DR1 and DR2. The second diagonal direction DDR2 may be defined as a direction crossing (intersecting) the first diagonal direction DDR1. However, an arrangement of the first to third light emitting regions PXA1, PXA2, and PXA3 is not limited thereto and may be arranged in various forms.

For example, when viewed in a plan view, the first to third light emitting regions PXA1, PXA2, and PXA3 may have a rectangular shape. However, embodiments are not limited thereto, and the first to third light emitting regions PXA1, PXA2, and PXA3 may have different shapes.

For example, when viewed in a plan view, the area of the second light emitting region PXA2 may be larger than the areas of the first and third light emitting regions PXA1 and PXA3. When viewed from a plan view, the area of the first light emitting region PXA1 may be larger than that of the third light emitting region PXA3. That is, the area of the second light emitting region PXA2 may be the largest, and the area of the third light emitting region PXA3 may be the smallest.

The embodiment shown in FIG. 5 is an example, and the shape, area, and arrangement of the first to third light emitting regions PXA1, PXA2, and PXA3 may be various depending on a design of the display module DM to have various light emission efficiency.

Figure 6:
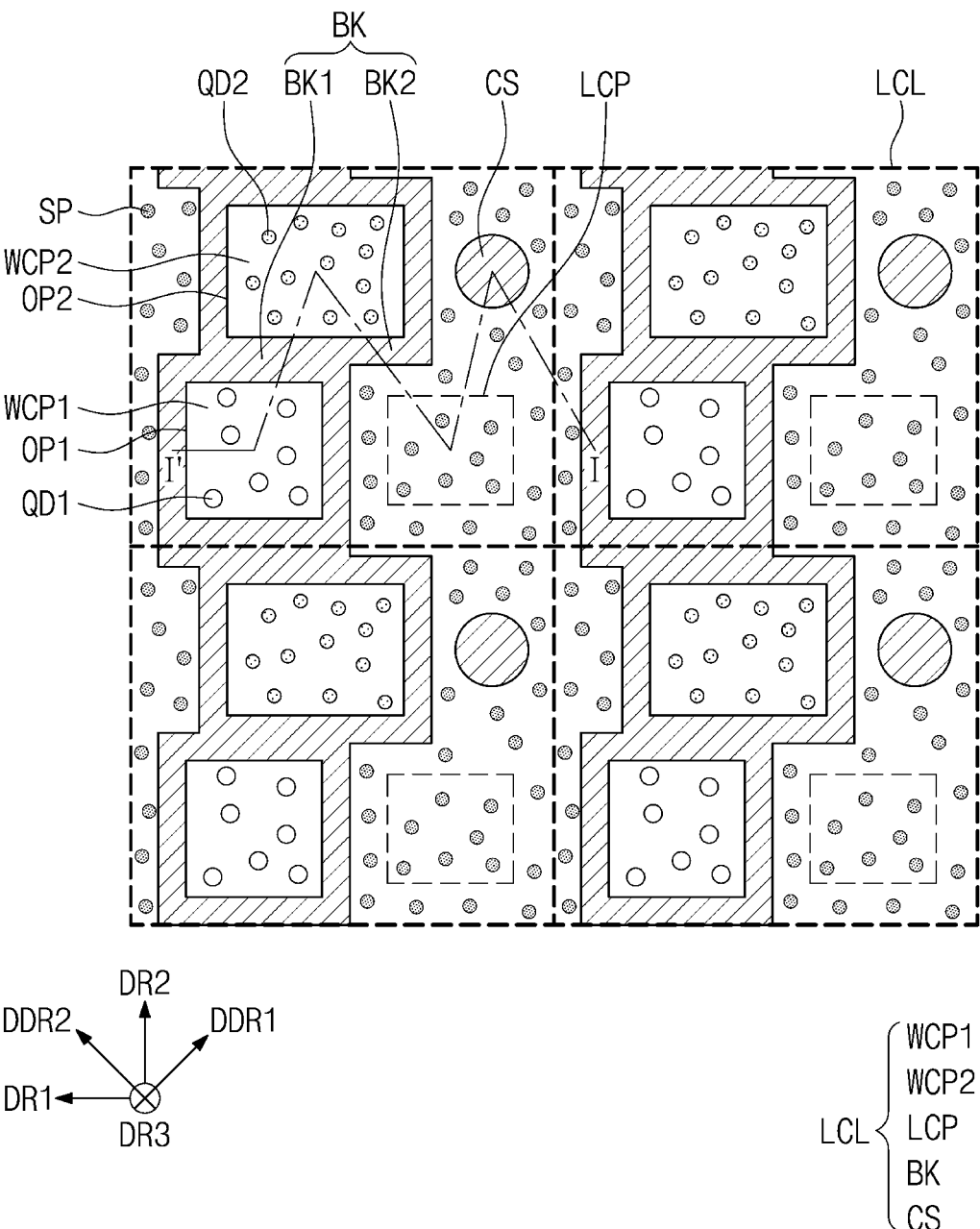
FIG. 6 is an enlarged schematic plan view of a light control layer disposed in a first region AA1 of FIG. 4.
Figure 7:
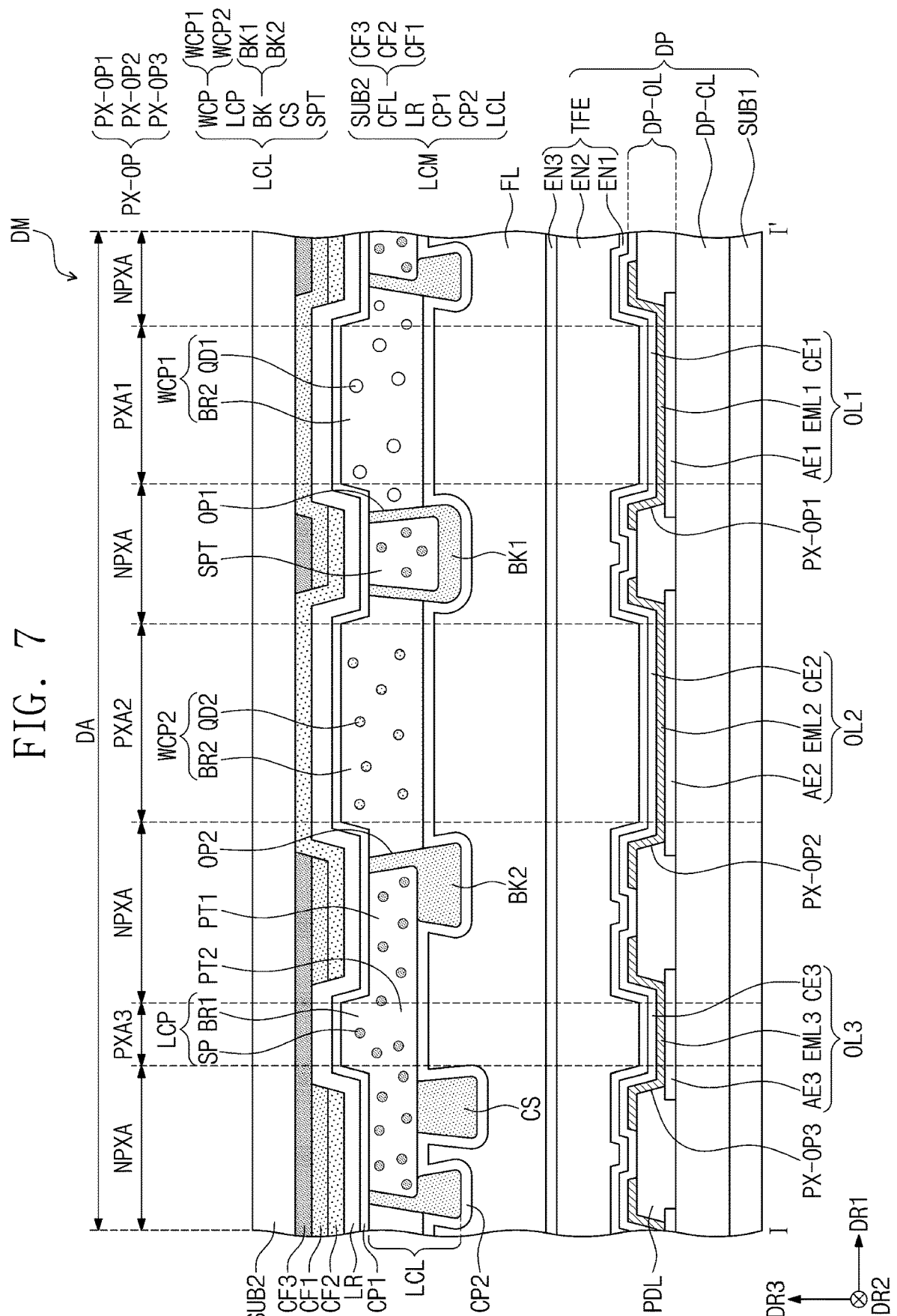
FIG. 7 is a schematic cross-sectional view of a display module shown in FIG. 5.

FIG. 6 is an enlarged schematic plan view of a light control layer disposed in the region 'AA1' of FIG. 4. FIG. 7 is a schematic cross-sectional view of a display module shown in FIG. 5.

For example, the light control layer LCL of FIG. 6 is a plan view viewed from a direction opposite to the third direction DR3 of the display module DM shown in FIG. 5.

For example, line I-I' in FIG. 5 is shown symmetrical with line I-I' in FIG. 6.

For example, FIG. 7 is a cross-sectional view taken along line I-I'.

A first substrate SUB1, a circuit layer DP-CL, a display element layer DP-OL, an encapsulation layer TFE, a filling member FL, and a light control member LCM of FIG. 7 may be the same as the first substrate SUB1, the circuit layer DP-CL, the display element layer DP-OL, the encapsulation layer TFE, the filling member FL, and the light control member LCM, and thus redundant descriptions will be omitted.

Referring to FIGS. 6 and 7, a display panel DP may include a lower substrate SUB1, a circuit layer DP-CL, a display element layer DP-OL, and an encapsulation layer TFE.

Although not shown, the display panel DP may include an insulating layer, a semiconductor pattern, a conductive pattern, and a signal line. In the manufacturing process, the display panel DP, the insulating layer, the semiconductor layer, and the conductive layer may be formed on the lower substrate SUB1 by coating, deposition, or the like, and thereafter, the insulating layer, the semiconductor layer, and the conductive layer may be selectively patterned. Through this process, semiconductor patterns, conductive patterns, and signal lines, included in the display panel DP may be formed.

The lower substrate SUB1 may provide a base surface on which the circuit layer DP-CL is formed. The lower substrate SUB1 may have a single-layer or multi-layer structure. For example, the multi-layered lower substrate SUB1 may include synthetic resin layers and at least one inorganic layer disposed between the synthetic resin layers, and/or may include a glass substrate and a synthetic resin layer disposed on the glass substrate. However, embodiments of the lower substrate SUB1 are not limited thereto.

The synthetic resin layer included in the lower substrate SUB1 may include at least one of acrylic resin, methacrylic resin, polyisoprene, vinyl resin, epoxy resin, urethane resin, cellulose resin, siloxane resin, polyamide resin, perylene resin, and a polyimide-based resin. However, the material of the synthetic resin layer is not limited thereto.

Although not shown, the circuit layer DP-CL may include driving elements constituting an equivalent circuit of pixels. For example, the circuit layer DP-CL may include at least one insulating layer, transistors connected to light emitting elements OL1, OL2, and OL3, at least one capacitor, signal lines, and the like. Multiple ones of the transistor may be provided. Multiple transistors and capacitors may be connected to each other. The transistor may include a semiconductor pattern, and the semiconductor pattern may be arranged in a certain rule in plan view depending on a configuration of an equivalent circuit of pixels. The semiconductor pattern may include polysilicon, amorphous silicon, crystalline oxide, and/or amorphous oxide.

The display element layer DP-OL may be disposed on the circuit layer DP-CL. The display element layer DP-OL may include the aforementioned first to third light emitting regions PXA1, PXA2, and PXA3 and the non-emitting region NPXA. The display element layer DP-OL may include multiple light emitting elements OL1, OL2, and OL3 and a pixel defining layer PDL.

Each of the light emitting elements OL1, OL2, and OL3 may include first to third light emitting elements OL1, OL2, and OL3 corresponding to the first to third light emitting regions PXA1, PXA2, and PXA3. Each of the first to third light emitting elements OL1, OL2, and OL3 may include first electrodes AE1, AE2, and AE3, light emitting layers EML1, EML2, and EML3, and second electrodes CE1, CE2, and CE3.

The first electrodes AE1, AE2, and AE3 of the first to third light emitting elements OL1, OL2, and OL3 may be spaced apart from each other and disposed on the circuit layer DP-CL. Although not shown, the first electrodes AE1, AE2, and AE3 of the first to third light emitting elements OL1, OL2, and OL3 may be connected to corresponding transistors of the circuit layer DP-CL. The first electrodes AE1, AE2, and AE3 may be connected to other transistors and at least one capacitor by directly connected transistors.

The pixel defining layer PDL may be disposed on the circuit layer DP-CL. For example, the pixel defining layer PDL may be disposed on an uppermost insulating layer of the circuit layer DP-CL. The pixel defining layer PDL may define light emitting openings PX-OP exposing at least a portion of each of the first electrodes AE1, AE2, and AE3 of the light emitting elements OL1, OL2, and OL3. Regions of the first electrodes AE1, AE2, and AE3 of the first to third light emitting elements OL1, OL2, and OL3 exposed by the light emitting openings PX-OP may correspond to the first to third light emitting regions PXA1, PXA2, and PXA3, respectively. The pixel defining layer PDL may correspond to the non-light emitting region NPXA surrounding the first to third light emitting regions PXA1, PXA2, and PXA3.

The light emitting openings PX-OP may include a first light emitting opening PX-OP1, a second light emitting opening PX-OP2, and a third light emitting opening PX-OP3. A length of the third light emitting opening PX-OP2 in a second direction DR2 may be smaller than lengths of the first and second light emitting openings PX-OP1 and PX-OP2 in the second direction DR2. A length of the first light emitting openings PX-OP1 in the second direction DR2 may be smaller than a length of the second light emitting openings PX-OP2 in the second direction DR2.

The pixel defining layer PDL may include a polymer resin. For example, the pixel defining layer PDL may include a polyacrylate-based resin or a polyimide-based resin. The pixel defining layer PDL may further include an inorganic material in addition to the polymer resin. Without being limited thereto, the pixel defining layer PDL may be formed of an inorganic material. For example, the pixel defining layer PDL may include silicon nitride (SiNx), silicon oxide (SiOx), silicon nitride oxide (SiOxNy), and/or the like.

In an embodiment, the pixel defining layer PDL may further include a light absorbing material. For example, the pixel defining layer PDL may include a black coloring agent. The black coloring agent may include a black dye or a black pigment. The black coloring agent may include carbon black, metals such as chromium, or oxides thereof. However, embodiments of the pixel defining layer PDL are not limited thereto.

The light emitting layers EML1, EML2, and EML3 of the first to third light emitting elements OL1, OL2, and OL3 may be disposed on the first electrodes AE1, AE2, and AE3, respectively. The light emitting layers EML1, EML2, and EML3 of the first to third light emitting elements OL1, OL2, and OL3 may be disposed to correspond to the light emitting openings PX-OP, respectively. Embodiments are not limited thereto, and the light emitting layers EML1, EML2, and EML3 of the first to third light emitting elements OL1, OL2, and OL3 may be provided as a common layer having an integral shape.

Each of the light emitting layers EML1, EML2, and EML3 may include an organic light emitting material, an inorganic light emitting material, a quantum dot, or a quantum rod. Each of the light emitting layers EML1, EML2, and EML3 of the first to third light emitting elements OL1, OL2, and OL3 may generate source light. Here, the source light may be a first light. For example, the first light may be blue light, but embodiments are not necessarily limited thereto.

The light emitting layers EML1, EML2, and EML3 of the first to third light emitting elements OL1, OL2, and OL3 may have the same configuration or have the same thickness as each other. However, structure and/or thickness of the light emitting layers EML1, EML2, and EML3 of the first to third light emitting elements OL1, OL2, and OL3 may be different from each other.

For example, a width of the third light emitting layer EML3 exposed to the outside in the second direction DR2 may be less than widths of the first and second light emitting layers EML1 and EML2 exposed to the outside in the second direction DR2. For example, a width of the first light emitting layer EML1 exposed to the outside in the second direction DR2 may be smaller than a width of the second light emitting layer EML2 exposed to the outside in the second direction DR2.

Each of the first to third light emitting elements OL1, OL2, and OL3 may be a light emitting element having a tandem structure in which multiple light emitting layers EML1, EML2, and EML3 are provided. The light emitting layers included in each of the first to third light emitting elements OL1, OL2, and OL3 may be layers generating substantially the same color light, but are not limited thereto, and some thereof may generate light of different colors. For example, each of the light emitting elements OL1, OL2, and OL3 may include four light emitting layers, and all four light emitting layers may substantially generate blue light, but embodiments are not limited thereto, and three light emitting layers among the four light emitting layers may generate blue light and one light emitting layer may generate green light. The light emitting elements OL1, OL2, and OL3 of the tandem structure may further include functional layers such as a hole control layer, an electron control layer, and a charge generation layer disposed between the light emitting layers.

The second electrodes CE1, CE2, and CE3 of the first to third light emitting elements OL1, OL2, and OL3 may be disposed on the light emitting layers EML1, EML2, and EML3. The second electrodes CE1, CE2, and CE3 of the first to third light emitting elements OL1, OL2, and OL3 may be integrally formed as a common layer. The second electrodes CE1, CE2, and CE3 may overlap the light emitting regions PXA1, PXA2, and PXA3 and the non-light emitting region NPXA. A common voltage may be provided to the pixels through the second electrodes CE1, CE2, and CE3.

The first voltage may be applied to the first electrodes AE1, AE2, and AE3, and a second voltage having a different level from the first voltage may be applied to the second electrodes CE1, CE2, and CE3. Holes and electrons injected into the light emitting layers EML1, EML2, and EML3 may be combined to form excitons, and the light emitting elements OL1, OL2, and OL3 may emit light while the excitons transition to a ground state.

The light emitting elements OL1, OL2, and OL3 may further include a light emitting functional layer such as a hole control layer and an electron control layer disposed between the first electrodes AE1, AE2, and AE3 and the second electrodes CE1, CE2, and CE3. The hole control layer may be disposed between the first electrode and the light emitting layer and may include at least one of a hole transport layer and a hole injection layer, and the electron control layer may be disposed between the light emitting layer and the second electrode and may include at least one of an electron transport layer and an electron injection layer. The light emitting functional layer of the light emitting elements OL1, OL2, and OL3 may be provided as a common layer and may overlap the light emitting regions PXA1, PXA2, and PXA3 and the non-light emitting region NPXA.

The encapsulation layer TFE may be disposed on the display element layer DP-OL to encapsulate the light emitting elements OL1, OL2, and OL3. The encapsulation layer TFE may include first to third encapsulation layers EN1, EN2, and EN3. The first encapsulation layer EN1 may be disposed on the second electrodes CE1, CE2, and CE3, and the second encapsulation layer EN2 and the third encapsulation layer EN3 may be sequentially disposed on the first encapsulation layer EN1.

In an embodiment, the first and third encapsulation layers EN1 and EN3 may include an inorganic layer, and the inorganic layer may protect the display element layer DP-OL from moisture and/or oxygen. For example, the inorganic layer may include at least one of aluminum oxide, titanium oxide, silicon oxide, silicon nitride, silicon oxynitride, zirconium oxide, and hafnium oxide, but is not limited thereto.

In an embodiment, the second encapsulation layer EN2 may include an organic layer, and the organic layer may protect the display element layer DP-OL from foreign substances such as dust particles. For example, the organic layer may include an acryl-based resin, but is not limited thereto.

The filling member FL may be disposed between the display panel DP and the light control member LCM. A space between the display panel DP and the light control member LCM may be filled by the filling member FL. However, embodiments are not limited thereto, and the filling member FL may be omitted, and the light control member LCM may be directly disposed on the display panel DP.

The light control member LCM may be disposed on the filling member FL. The light control member LCM may be disposed on the display panel DP. The light control member LCM may include an upper substrate SUB2, a color filter layer CFL, a low refractive index layer LR, a light control layer LCL, a first capping layer CP1, and a second capping layer CP2. A rear surface of the upper substrate SUB2 may face an upper surface of the lower substrate SUB1. The color filter layer CFL, the low refractive index layer LR, the first capping layer CP1, the light control layer LCL, and the second capping layer CP2 may be disposed sequentially on the rear surface of the upper substrate SUB2 in a third direction DR3.

The light control layer LCL may include light conversion layers WCP, a light transmission layer LCP, bank layers BK, a support layer SPT, and spacers CS. Hereinafter, the light conversion layer WCP, the light transmission layer LCP, the bank layer BK, and the spacer CS will be described.

The light transmission layer LCP may be disposed between the display panel DP and the low refractive index layer LR. The light transmission layer LCP may be disposed on a rear surface of the first capping layer CP1.

The light transmission layer LCP may overlap the third light emitting region PXA3 and the non-light emitting regions NPXA adjacent to the third light emitting region PXA3. The light transmission layer LCP may include first parts PT1 and second part PT2. The first parts PT1 may overlap the non-light emitting region NPXA. The second part PT2 may overlap the third light emitting region PXA3. The second part PT2 may overlap the third light emitting element OL3.

The second part PT2 may be disposed between the first parts PT1. When viewed in a plan view, the first parts PT1 may surround the second part PT2. The first parts PT1 and the second parts PT2 may be integrally formed with each other. The first parts PT1 may be defined as an edge of the light transmission layer LCP.

The first part PT1 and the second part PT2 may include the same material. Each of the first parts PT1 and the second part PT2 may include a first base resin BR1 and scatterers SP dispersed in the first base resin BR1. The scatterers SP may scatter light incident from the third light emitting element OL3 to the light transmission layer LCP in various directions. The scatterers SP may be particles having a relatively high density or specific gravity. For example, the scatterers SP may include titanium oxide (TiOx) or silica-based nanoparticles. The scatterers SP may improve light emission efficiency of light provided from the light emitting element and passing through the light controller LCP.

The light transmission layer LCP may transmit the first light provided from the third light emitting element OL3.

For example, the third light emitting element OL3 may provide blue light to the light transmission layer LCP, and the blue light may pass through the light transmission layer LCP and be emitted toward the front surface of the display module DM.

The support layer SPT may be disposed between the light conversion layers WCP adjacent to each other in the second direction DR2. The support layer SPT may overlap the non-light emitting region NPXA. The support layer SPT may be disposed on a rear surface of the first capping layer CP1.

The support layer SPT may include the same material as the light transmission layer LCP. For example, the support layer SPT may include a first base resin BR1 and scatterers SP.

The bank layers BK may be disposed on the first parts PT1 and the support layer SPT. Some of the bank layers BK may cover the support layer SPT. Hereinafter, the bank layer BK covering the support layer SPT may be defined as a first bank layer BK1.

Other portions of the bank layers BK may cover the edge of the light transmission layer LCP. Portions of the light transmission layer LCP spaced apart from the edge of the light transmission layer LCP may be exposed to the outside from the bank layers BK. For example, bank layers BK may be disposed on the first part PT1, and the second part PT2 may be exposed to the outside from the bank layers BK. Hereinafter, the bank layers BK disposed on the edge of the light transmission layer LCP may be defined as second bank layers BK2.

The first and second bank layers BK1 and BK2 may include black pigment and water repellent materials. As the first and second bank layers BK1 and BK2 may include black pigment, the first and second bank layers BK1 and BK2 may have a black color. Accordingly, the bank layers BK may block light so that the light emitted from the light emitting elements OL1, OL2, and OL3 are not mixed.

A preliminary bank layer to be described later may be applied, and then patterned through exposure and etching to form the bank layers BK. In case that the preliminary bank layer is exposed, a photo mask may be disposed on the preliminary bank layer. Multiple openings may be defined in the photo mask. Light may be incident through the openings. The preliminary bank layer not exposed to light may be removed through an etching process, and the preliminary bank layer exposed to light may not be removed. Accordingly, the bank layers BK may be formed. However, as the preliminary bank layer includes a black pigment, light may be absorbed from an upper surface of the preliminary bank layer toward the first capping layer CP1, and thus an amount of light reaching the first capping layer CP1 may decrease. Accordingly, a sufficient amount of light may not reach the preliminary bank layer adjacent to the first capping layer CP1.

In case that the bank layers BK are patterned on the rear surface of the first capping layer CP1 without the support layer SPT and the edge of the light transmission layer LCP, a portion the preliminary bank layer to be the bank layers BK may be removed from the upper substrate SUB2 during an etching process in case not sufficiently exposed to light. Accordingly, color mixing of light emitted from the light emitting elements OL1, OL2, and OL3 cannot be prevented, and defects may occur.

However, as the bank layers BK cover the light transmission layer LCP and the support layer SPT, the light transmission layer LCP and the support layer SPT may support the bank layers BK. According to this structure, even in case that the preliminary bank layer adjacent to the first capping layer CP1 is not sufficiently exposed, the patterned bank layers BK may not be separated from the upper substrate SUB2 during the etching process. Accordingly, the bank layers BK may prevent color mixing of light emitted from the light emitting elements OL1, OL2, and OL3, thereby improving color matching rate and reducing defect rate. Formation of the bank layers BK will be described in detail with reference to FIGS. 12C and 12D.

Multiple openings OP1 and OP2 may be defined in the light control layer LCL. The openings OP1 and OP2 may be defined by the first and second bank layers BK1 and BK2.

The spacer CS may be disposed on the light transmission layer LCP. The spacer CS may be spaced apart from an edge of the light transmission layer LCP. The spacer CS may overlap the non-light emitting region NPXA. The spacer CS may be disposed between the second bank layers BK2. The spacer CS may be spaced apart from the second bank layers BK2. As shown in FIG. 6, when viewed in a plan view, the spacers CS may be spaced apart from the bank layers BK.

An upper surface of the spacer CS may be disposed at a different height from an upper surface of the second bank layers BK2. The upper surface of the spacer CS may be closer to the display panel DP than the upper surface of the second bank layers BK2.

The spacer CS may include the same material as the first and second bank layers BK1 and BK2. The spacer CS may include a black pigment and a water repellent material. The spacer CS may be simultaneously formed by the same process as the first and second bank layers BK1 and BK2. Formation of the spacer CS and the bank layers BK will be described in detail with reference to FIGS. 12C and 12D.

The spacer CS may increase resistance to compressive force due to external pressure or impact. Accordingly, the spacer CS may serve to prevent deformation of the light control layer LCL.

In case that the spacer CS includes the same material as the light transmission layer LCP, and the spacer CS and the light transmission layer LCP are simultaneously formed through the same process, a thickness of each of the spacer CS and the light transmission layer LCP may not be readily controllable. For example, in case that a height of an upper surface of the light transmission layer LCP is lowered, a height of the upper surface of the spacer CS may also be lowered. In case that the height of the upper surface of the spacer CS is increased, the height of the upper surface of the light transmission layer LCP may also be increased. Accordingly, in case that the thickness of the spacer CS and the thickness of the light transmission layer LCP are not adjusted to the set thickness, defects may occur and yield may decrease.

However, in case that the spacer CS and the second bank layers BK2 include the same material and the spacer CS is formed through a process different from that of the light transmission layer LCP, a thickness of each of the spacer CS and the light transmission layer LCP may be readily controllable. Accordingly, each of the spacer CS and the light transmission layer LCP may be formed to a set thickness. Therefore, the defect rate may be reduced, and the yield may be increased.

The light conversion layers WCP may be disposed in the openings OP1 and OP2. The light conversion layers WCP may be disposed between first and second capping layers CP1 and CP2 to be described later. The light conversion layer WCP and the light transmission layer LCP may be disposed between the low refractive index layer LR and the display panel DP. The light conversion layer WCP and the light transmission layer LCP may be disposed on the same layer. The light conversion layers WCP may overlap the first light emitting region PXA1 and the second light emitting region PXA2. The light conversion layers WCP may overlap the first light emitting element OL1 and the second light emitting element OL2.

The light conversion layers WCP may include a first light conversion layer WCP1 and a second light conversion layer WCP2. The first light conversion layers WCP1 may be disposed in the first opening OP1. The second light conversion layers WCP2 may be disposed in the second opening OP2. The first bank layer BK1 may be disposed between the first light conversion layer WCP1 and the second light conversion layer WCP2. When viewed in a plan view, the first light emitting region PXA1 and the second light emitting region PXA2 may be surrounded by bank layers BK.

The first light conversion layer WCP1 may overlap the first light emitting region PXA1. The first light conversion layer WCP1 may overlap the first light emitting element OL1. The second light conversion layer WCP2 may overlap the second light emitting region PXA2. The second light conversion layer WCP2 may overlap the second light emitting element OL2.

A width of the second light conversion layer WCP2 in the second direction DR2 may be greater than a width of the first light conversion layer WCP1 in the second direction DR2.

The first light conversion layer WCP1 may include a second base resin BR2 and first quantum dots QD1 dispersed in the second base resin BR2. The second light conversion layer WCP2 may include a second base resin BR2 and second quantum dots QD2 dispersed in the second base resin BR2.

Cores of the quantum dots QD1 and QD2 included in each of the first light conversion layer WCP1 and the second light conversion layer WCP2 may include a group II-VI compound, a group III-VI compound, and a group I-III-VI compound, a group III-V compound, a group IV-VI compound, a group IV element, a group IV compound, and combinations thereof.

The group II-VI compound may include a binary element compound selected from a group consisting of CdSe, CdTe, CdS, ZnS, ZnSe, ZnTe, ZnO, HgS, HgSe, HgTe, MgSe, MgS and mixtures thereof, a ternary element compound selected from a group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures thereof, a quaternary element compound selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe and mixtures thereof.

The group III-VI compound may include a binary element compound such as $In_2S_3$, $In_2Se_3$, or the like, a ternary element compound such as $InGaS_3$, $InGaSe_3$, or the like, or any combination thereof.

The group I-III-VI compound may include a ternary element compound selected from a group consisting of AgInS, $AgInS_2$, CuInS, $CuInS_2$, $AgGaS_2$, $CuGaS_2$, $CuGaO_2$, $AgGaO_2$, $AgAlO_2$ and mixtures thereof, or a quaternary element compound such as $AgInGaS_2$ and $CuInGaS_2$.

The group III-V compound may include a binary element compound selected from a group consisting of GaN, GaP, GaAs, GaSb, AlN, AlP, AlAs, AlSb, InN, InP, InAs, InSb, and mixtures thereof, a ternary element compound selected from a group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb and mixtures thereof, and a quaternary element compound selected from a group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. The group III-V compound may further include a group II metal. For example, InZnP and the like may be selected as the III-II-V compound.

The group IV-VI compound may include a binary element compound selected from a group consisting of SnS, SnSe, SnTe, PbS, PbSe, PbTe and mixtures thereof, a ternary element compound selected from a group consisting of SnSeS, SnSeTe, SnSTe, PbSeS, PbSeTe, PbSTe, SnPbS, SnPbSe, SnPbTe and mixtures thereof, and a quaternary element compound selected from a group consisting of SnPbSSe, SnPbSeTe, SnPbSTe and mixtures thereof. The group IV element may be selected from the group consisting of Si, Ge, and mixtures thereof. The group IV compound may be a binary element compound selected from a group consisting of SiC, SiGe, and mixtures thereof.

Each element included in the multi-element compound such as the binary element compound, the ternary element compound, and the quaternary element compound may be present in a particle at a uniform concentration or a non-uniform concentration. For example, the described-above chemical formula may mean the types of elements included in the compound, and the element ratios in the compound may be different. For example, $AgInGaS_2$ may mean $AgIn_xGa_{1-x}S_2$ ('x' is a real number between 0 and 1).

The quantum dot may have a single structure in which a concentration of each element included in the quantum dot is uniform or a dual core-shell structure. For example, a material included in aa core and a material included in a shell may be different from each other.

In an embodiment, the quantum dots QD1 and QD2 may have a core-shell structure including the aforementioned nanocrystal. The shell of the quantum dots may serve as a protective layer to maintain semiconductor characteristics by preventing chemical denaturation of the core and/or may serve as a charging layer for imparting electrophoretic characteristics to the quantum dots. The shell may be monolayer or multilayer. An interface between the core and the shell may have a concentration gradient in which the concentration of elements present in the shell decreases toward a center. Examples of the quantum dot shell include a metallic oxide, a non-metallic oxide, a semiconductor compound, or combinations thereof.

For example, the metallic oxide and a non-metallic oxide may include a binary element compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, or $NiO$ or a ternary element compound such as $MgAl_2O_4$, $CoFe_2O_4$, $NiFe_2O_4$, and $CoMn_2O_4$, but the material is not limited thereto.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but the material is not limited thereto.

Each element included in the multi-element compound such as the binary element compound or the ternary compound may be present in a particle at a uniform or non-uniform concentration. For example, the described-above chemical formula may mean the types of elements included in the compound, and the element ratios in the compound may be different.

The quantum dots QD1 and QD2 may have a full width of half maximum (FWHM) of an emission wavelength spectrum of about 45 nm or less, in an embodiment about 40 nm or less, in another embodiment about 30 nm or less, and color purity and color reproducibility may be improved within the above range. Light emitted through the quantum dots QD1 and QD2 may be emitted in all directions, thereby improving a wide viewing angle.

A shape of the quantum dots QD1, QD2 is not particularly limited to a shape commonly used in the art, but for example, spherical, pyramidal, multi-arm, or cubic nanoparticles, nanotubes, nanowires, nanofibers, nanoplatelet particles, and the like may be used.

The quantum dots QD1 and QD2 may control colors of emitted light depending on a particle size, and accordingly, the quantum dots QD1 and QD2 may have various luminous colors such as blue, red, and green.

Accordingly, the first quantum dots QD1 may convert the first light provided by the first light emitting element OL1 into second light having a different wavelength range from the first light. For example, the first quantum dots QD1 may convert the first light provided by the first light emitting element OL1 into red light. Accordingly, the display module DM may emit red light through the first light emitting region PXA1.

The second quantum dots QD2 may convert the first light provided by the second light emitting element OL2 into third light having a different wavelength range from the first light. Here, a wavelength range of the second light and a wavelength range of the third light may be different from each other. For example, the second quantum dots QD2 may convert the first light provided by the second light emitting element OL2 into green light. Accordingly, the display module DM may emit green light through the second light emitting region PXA2.

The low refractive index layer LR may be disposed between the light control layer LCL and the color filter layer CFL. The low refractive index layer LR may have a refractive index smaller than each of the refractive index of the first and second light conversion layers WCP1 and WCP2 and the light transmission layer LCP. For example, the refractive index of the low refractive index layer LR may be about 1.1 or more and about 1.5 or less, specifically about 1.1 or more and about 1.35 or less. However, the refractive index of the low refractive index layer LR is not limited thereto. The low refractive index layer LR may include a low refractive index organic layer having a relatively low refractive index. The low refractive index layer LR may further include hollow particles and/or voids dispersed in the organic layer, and the refractive index of the low refractive layer LR may be controlled by a ratio of hollow particles and/or voids.

The low refractive index layer LR disposed on the light control layer LCL may not be converted by the light conversion layers WCP1 and WCP2 using the refractive index, but may allow the light emitted from upper surfaces of the light conversion layers WCP1 and WCP2 to be incident into the light conversion layers WCP1 and WCP2 again. Light re-incident into the light conversion layers WCP1 and WCP2 by the low refractive index layer LR may be converted by the quantum dots QD1 and QD2. For example, the low refractive index layer LR may improve light emission efficiency of the display device DD (refer to FIG. 1) through recycling of light using the refractive index.

The low refractive index layer LR may include a material having high light transmittance. For example, the low refractive index layer LR may have a high transmittance of about 90% or more. As the low refractive index layer LR has high transmittance, the transmittance of light emitted toward a front surface of the display module DM may not be reduced.

The first capping layer CP1 may be disposed on a rear surface of the low refractive index layer LR facing the display panel DP. The first capping layer CP1 may include an inorganic material. The first capping layer CP1 may prevent moisture or gas from entering the low refractive index layer LR.

The second capping layer CP2 may be disposed on the light control layer LCL facing the display panel DP. The second capping layer CP2 may include an inorganic material. The second capping layer CP2 may prevent moisture or foreign substances from entering the light control layer LCL. The first capping layer CP1 and the second capping layer CP2 may cover upper and lower portions of the light control layer LCL to protect the light control layer LCL and prevent deterioration due to moisture.

The color filter layer CFL may include a first color filter CF1, a second color filter CF2, and a third color filter CF3. The first to third color filters CF1, CF2, and CF3 may be disposed to correspond to the first to third light emitting regions PXA1, PXA2, and PXA3 in plan view, respectively. For example, the first color filter CF1 may overlap the first light emitting region PXA1, the second color filter CF2 may overlap the second light emitting region PXA2, and the third color filter CF3 may overlap the third light emitting region PXA3.

Each of the first to third color filters CF1, CF2, and CF3 may include a base resin and a pigment or dye dispersed in the base resin. Each of the first to third color filters CF1, CF2, and CF3 may transmit light having a specific wavelength range and absorb most of light having a wavelength range outside the specific wavelength range.

For example, the first color filter CF1 may include a red color filter. The second color filter CF2 may include a green color filter. The third color filter CF3 may include a blue color filter. The red color filter may transmit red light and absorb most of green light and blue light. The green color filter may transmit green light and absorb most of red light and blue light. The blue color filter may transmit blue light and absorb most of red light and green light.

The first color filter CF1 may be disposed on the first light conversion layer WCP1. The first color filter CF1 may transmit second light provided from the first light conversion layer WCP1. For example, the first light conversion layer WCP1 may convert the first light provided from the first light emitting element OL1 into red light, and the first color filter CF1 may transmit the red light provided from the first light conversion layer WCP1. The first color filter CF1 may absorb green light and blue light incident toward the first color filter CF1. The first color filter CF1 may absorb the light that is not changed by the first light conversion layer WCP1 among lights incident toward the first color filter CF1, thereby preventing deterioration of color purity in the first light emitting region PXA1.

The second color filter CF2 may be disposed on the second light conversion layer WCP2 to transmit third light provided from the second light conversion layer WCP2. For example, the second light conversion layer WCP2 may convert the first light provided from the second light emitting element OL2 into green light, and the second color filter CF2 may transmit green light provided from the second light conversion layer WCP2. The second color filter CF2 may absorb red light and blue light incident toward the second color filter CF2. The second color filter CF2 may absorb the light that is not changed by the second light conversion layer WCP2 among lights incident toward the second color filter CF2, thereby preventing deterioration of color purity in the second light emitting region PXA2.

The third color filter CF3 may be disposed on the light transmission layer LCP. The third color filter CF3 may overlap the second part PT2 of the light transmission layer LCP. The third color filter CF3 may transmit the first light provided from the third light emitting element OL3 and passing through the light transmission layer LCP. For example, the third color filter CF3 may transmit blue light and absorb green light and red light, thereby preventing deterioration of color purity in the third light emitting region PXA3.

External light, such as natural light, may be incident toward the display module DM from the outside of the display module DM. The external light may include red light, green light, and blue light. In case that the display module DM does not include the color filter layer CFL, the external light incident toward the display module DM may be reflected by the conductive patterns (e.g., the signal lines, the electrodes, etc.) inside the display module DM and provided to a user, and the user may view the reflected light.

The first to third color filters CF1, CF2, and CF3 may prevent reflection of the external light. For example, the first color filter CF1 may be a red color filter, and may filter the external light into red light while absorbing green light and blue light among the external light. According to this principle, the second color filter CF2 may be a green color filter, and may filter the external light into green light while absorbing red light and blue light among the external light. The third color filter CF3 may be a blue color filter, and may filter the external light into blue light while absorbing red light and green light among the external light.

At least two of the first to third color filters CF1, CF2, and CF3 may overlap each other within the non-light emitting region NPXA. For example, the first to third color filters CF1, CF2, and CF3 may be disposed to overlap each other in the third direction DR3 in the non-light emitting region NPXA. For example, the first color filter CF1 may be disposed on the third color filter CF3, and the second color filter CF2 may be disposed on the first color filter CF1.

The first to third color filters CF1, CF2, and CF3 disposed to overlap each other may overlap the first part PT1 of the light transmission layer LCP. The first to third color filters CF1, CF2, and CF3 disposed to overlap each other may overlap the support layer SPT. The first to third color filters CF1, CF2, and CF3 disposed to overlap each other may extend onto the bank layers BK1 and BK2 and overlap each other. The first to third color filters CF1, CF2, and CF3 disposed to overlap each other may block light passing through the non-light emitting region NPXA, and thus mixing of colors between the first to third light emitting regions PXA1, PXA2, and PXA3 may be prevented.

The upper substrate SUB2 may be disposed on the color filter layer CFL. The upper substrate SUB2 may include a glass substrate, a polymer substrate, and/or an organic/inorganic composite material substrate. The upper substrate SUB2 may include a front surface and a rear surface parallel to the first and second directions DR1 and DR2, respectively. The rear surface of the upper substrate SUB2 may face the upper surface of the lower substrate SUB1. The upper substrate SUB2 may provide a base surface on which components of the light control member LCM are stacked on each other.

Figure 8:
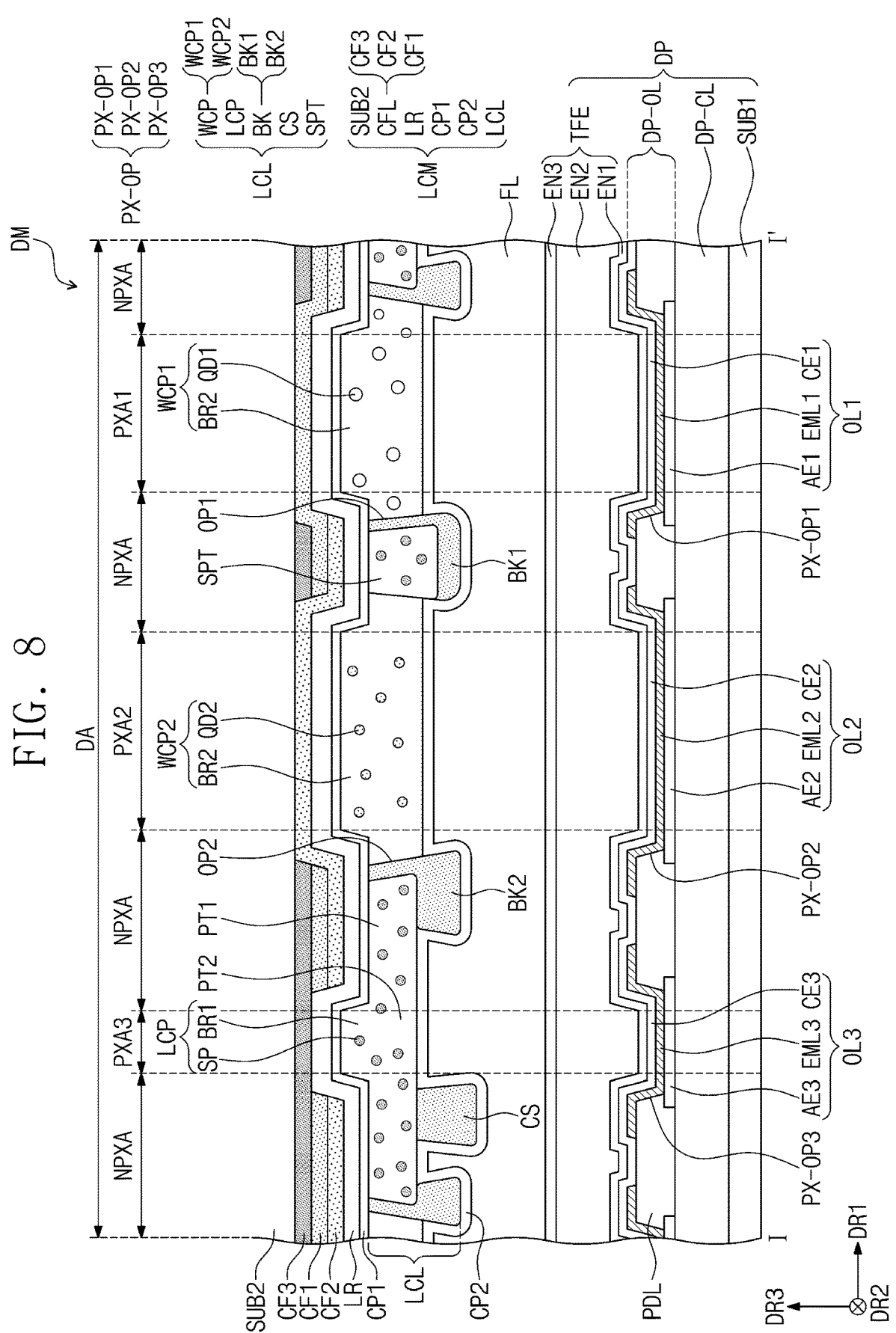
FIG. 8 is a schematic cross-sectional view of a display module according to another embodiment of the disclosure.

FIG. 8 is a schematic cross-sectional view of a display module according to another embodiment of the disclosure. For example, FIG. 8 is a cross-sectional view taken along line I-I' of FIG. 5.

A display panel DP, the filling member FL, a first and second capping layers CP1 and CP2, a light transmission layer LCP, a light conversion layer WCP, a color filter layer CFL, an upper substrate SUB2, a spacer CS, and second bank layers BK2 of FIG. 8 may be the same as the display panel DP, the filling member FL, the first and second capping layers CP1 and CP2, light transmission layer LCP, the light conversion layer WCP, the color filter layer CFL, the upper substrate SUB2, the spacer CS, and the second bank layers BK2 of FIG. 7, and thus redundant descriptions thereof will be omitted or simplified.

Referring to FIG. 8, a first bank layer BK1 may cover an upper surface of a support layer SPT. The first bank layer BK1 may cover at least one side surface of both side surfaces of the support layer SPT. For example, the first bank layer BK1 may cover a side of opposite sides of the support layer SPT in the second direction DR2. Another side of the support layer SPT may be exposed to the outside from the first bank layer BK1 and may be in contact with the second light conversion layer WCP2. A side of the support layer SPT may be defined as a side opposite to the other side adjacent to the second light conversion layer WCP2. However, embodiments are not limited thereto, and the first bank layer BK1 may cover a side of the support layer SPT, and another side of the support layer SPT may be exposed to the outside from the first bank layer BK1 and may be in contact with the first light conversion layer WCP1.

Figure 9:
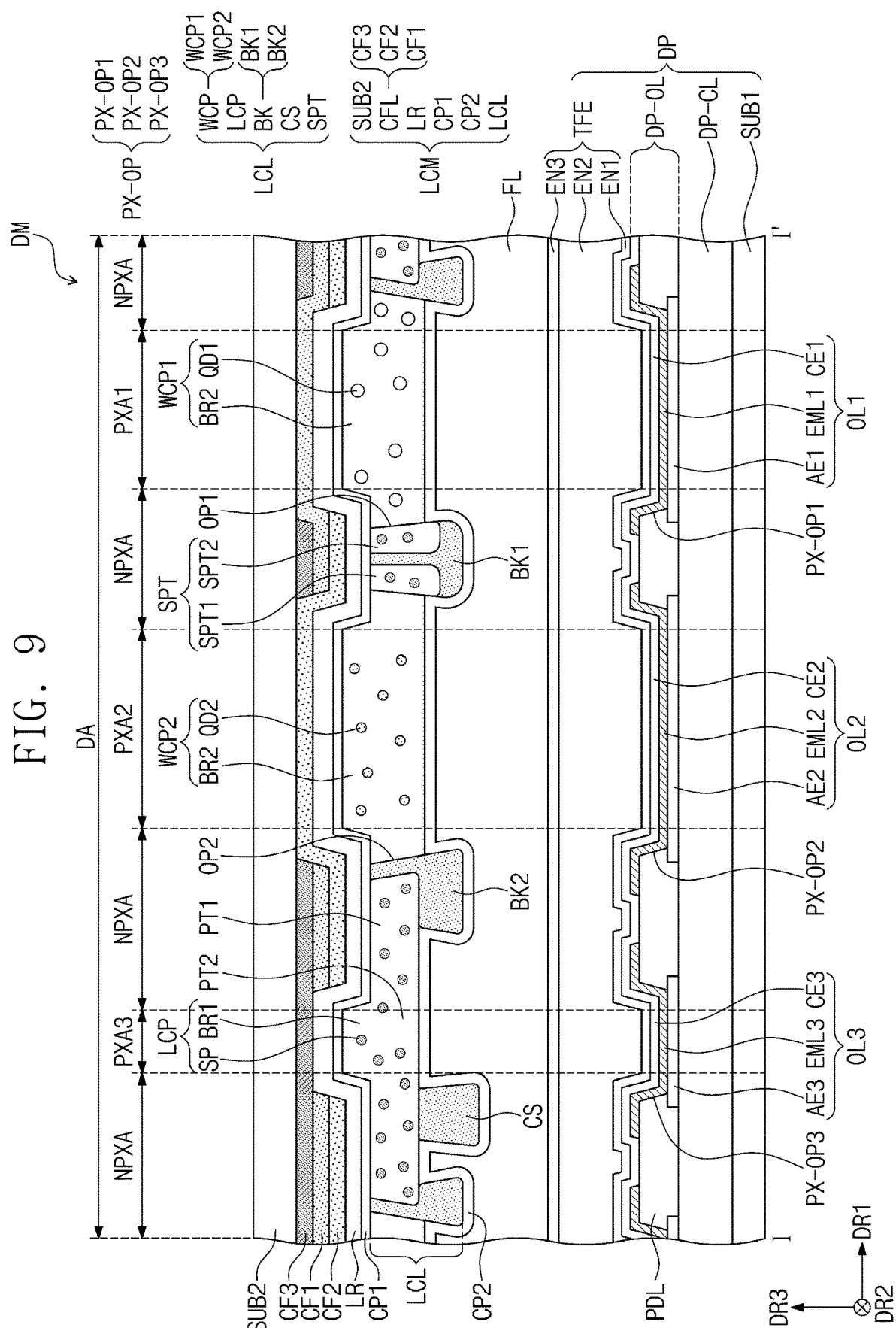
FIG. 9 is a schematic cross-sectional view of a display module according to another embodiment of the disclosure.

FIG. 9 is a schematic cross-sectional view of a display module according to another embodiment of the disclosure.

For example, FIG. 9 is a cross-sectional view taken along line I-I' of FIG. 5.

A display panel DP, a filling member FL, a first and second capping layers CP1 and CP2, a light transmission layer LCP, a light conversion layer WCP, a color filter layer CFL, an upper substrate SUB2, a spacer CS, and a second bank layers BK2 of FIG. 9 may be the same as the display panel DP, the filling member FL, the first and second capping layers CP1 and CP2, the light transmission layer LCP, the light conversion layer WCP, the color filter layer CFL, the upper substrate SUB2, the spacer CS, and the second bank layers BK2, and thus redundant descriptions thereof will be omitted or simplified.

Referring to FIG. 9, a support layer SPT may include a first support layer SPT1 and a second support layer SPT2. The first and second support layers SPT1 and SPT2 may be disposed to be symmetrical to each other with the first bank layer BK1 as a center.

The first bank layer BK1 may be disposed on upper surfaces of the first and second support layers SPT1 and SPT2. A side of opposite side surfaces of each of the support layers SPT in the first direction DR1 may be in contact with the first bank layer BK1. Another side surface of opposite side surfaces of each of the support layers SPT in the first direction DR1 may be in contact with a corresponding light conversion unit WCP among the light conversion units WCP. A side surface of the support layers SPT may be defined as surfaces facing the first bank layer BK1.

Figure 10:
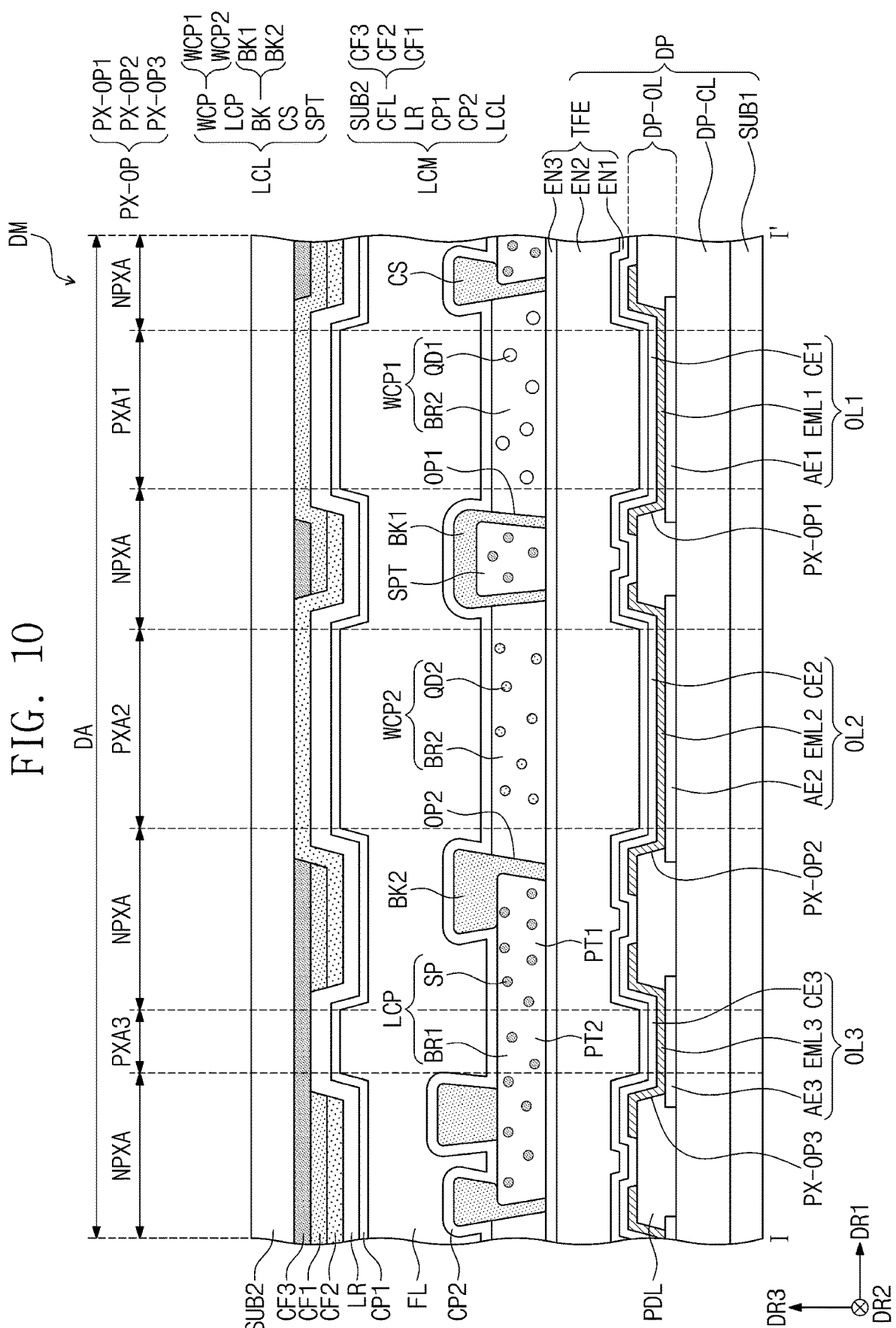
FIG. 10 is a schematic cross-sectional view of a display module according to another embodiment of the disclosure.

FIG. 10 is a schematic cross-sectional view of a display module according to another embodiment of the disclosure.

For example, FIG. 10 is a cross-sectional view taken along line I-I' of FIG. 5.

A display panel DP, a first capping layer CP1, a low refractive index layer LR, a color filter layer CFL, an upper substrate SUB2 of FIG. 10 may be the same as the display panel DP, the first capping layer CP1, the low refractive index layer LR, the color filter layer CFL, and the upper substrate SUB2, and thus redundant description thereof will be omitted or simplified.

Also, descriptions redundant with those of FIG. 7 in FIG. 10 will be omitted.

Referring to FIG. 10, a light transmission layer LCP and light conversion layers WCP may be disposed on an upper surface of the encapsulation layer TFE. The first and second bank layers BK1 and BK2 may be disposed on an upper surface of the encapsulation layer TFE.

A spacer CS may be disposed on the light transmission layer LCP. An upper surface of the spacer CS may be spaced further from the display panel DP than an upper surface of the second bank layers BK2.

A second capping layer CP2 may be disposed on the bank layers BK, the light transmission layer LCP, the light conversion layers WCP, and the spacer CS. The second capping layer CP2 may cover the bank layers BK, the light transmission layer LCP, the light conversion layers WCP, and the spacer CS.

A filling member FL may be disposed on the second capping layer CP2. The filling member FL may be disposed between the first capping layer CP1 and the second capping layer CP2.

The first capping layer CP1, the color filter layer CFL, and the upper substrate SUB2 may be disposed on the filling member FL. Hereinafter, the first capping layer CP1, the color filter layer CFL, and the upper substrate SUB2 may be the same as the first capping layer CP1, the color filter layer CFL, and the upper substrate SUB2 described with reference to FIG. 7, and thus explanation thereof will be omitted.

Figure 11:
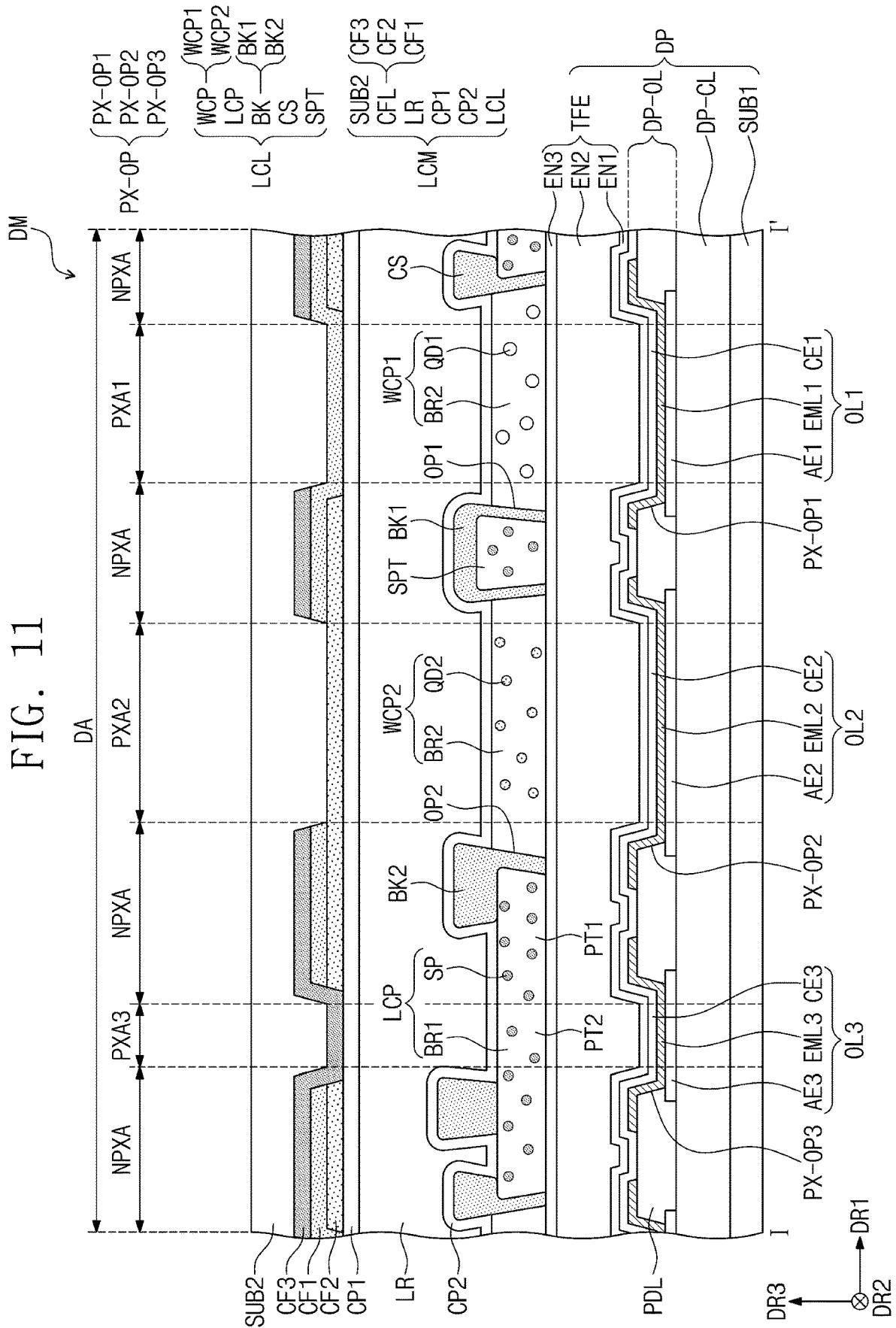
FIG. 11 is a schematic cross-sectional view of a display module according to another embodiment of the disclosure.

FIG. 11 is a schematic cross-sectional view of a display module according to another embodiment of the disclosure.

For example, FIG. 11 is a cross-sectional view taken along line I-I' of FIG. 5.

A display panel DP of FIG. 11 may be the same as the display panel DP of FIG. 7, and thus redundant description thereof will be omitted.

Referring to FIG. 11, a light transmission layer LCP, light conversion layers WCP, and bank layers BK1 and BK2 may be disposed on the display panel DP. The light transmission layer LCP, the light conversion layers WCP, and the bank layers BK1 and BK2 may be disposed on an upper surface of an encapsulation layer TFE.

A second capping layer CP2 may be disposed on the light transmission layer LCP, the light conversion layers WCP, and the bank layers BK1 and BK2. The second capping layer CP2 may cover the light transmission layer LCP, the light conversion layers WCP, and the bank layers BK1 and BK2.

A low refractive index layer LR may be disposed on the second capping layer CP2. The low refractive index layer LR may cover the second capping layer CP2.

A first capping layer CP1 may be disposed on the low refractive index layer LR. A color filter layer CFL may be disposed on the first capping layer CP1. The first color filter CF1 may overlap the first light emitting region PXA1. The second color filter CF2 may overlap the second light emitting region PXA2. The third color filter CF3 may overlap the third light emitting region PXA3.

The first to third color filters CF1, CF2, and CF3 may overlap each other within the non-light emitting region NPXA. A stacking order of the first to third color filters CF1, CF2, and CF3 overlapping each other in the non-light emitting region NPXA shown in FIG. 11 may be different from a stacking order of the first to third color filters CF1, CF2, and CF3 overlapping each other in the non-light emitting region NPXA shown in FIG. 7. For example, in the non-light emitting region NPXA, the first color filter CF1 may be disposed on the second color filter CF2. The third color filter CF3 may be disposed on the first color filter CF1.

The first to third color filters CF1, CF2, and CF3 disposed to overlap each other may block light passing through the non-light emitting region NPXA, thereby preventing color mixing between the first to third light emitting regions PXA1, PXA2, and PXA3.

An upper substrate SUB2 may be disposed on the color filter layer CFL. The upper substrate SUB2 may cover the color filter layer CFL.

FIGS. 12A to 12I are schematic views illustrating a process for forming a light control layer shown in FIGS. 6 and 7.

For example, FIGS. 12A, 12C, 12F, and 12I are plan views.

For example, FIGS. 12B, 12D, 12E, 12G, and 12H are cross-sectional views.

Figure 12A:
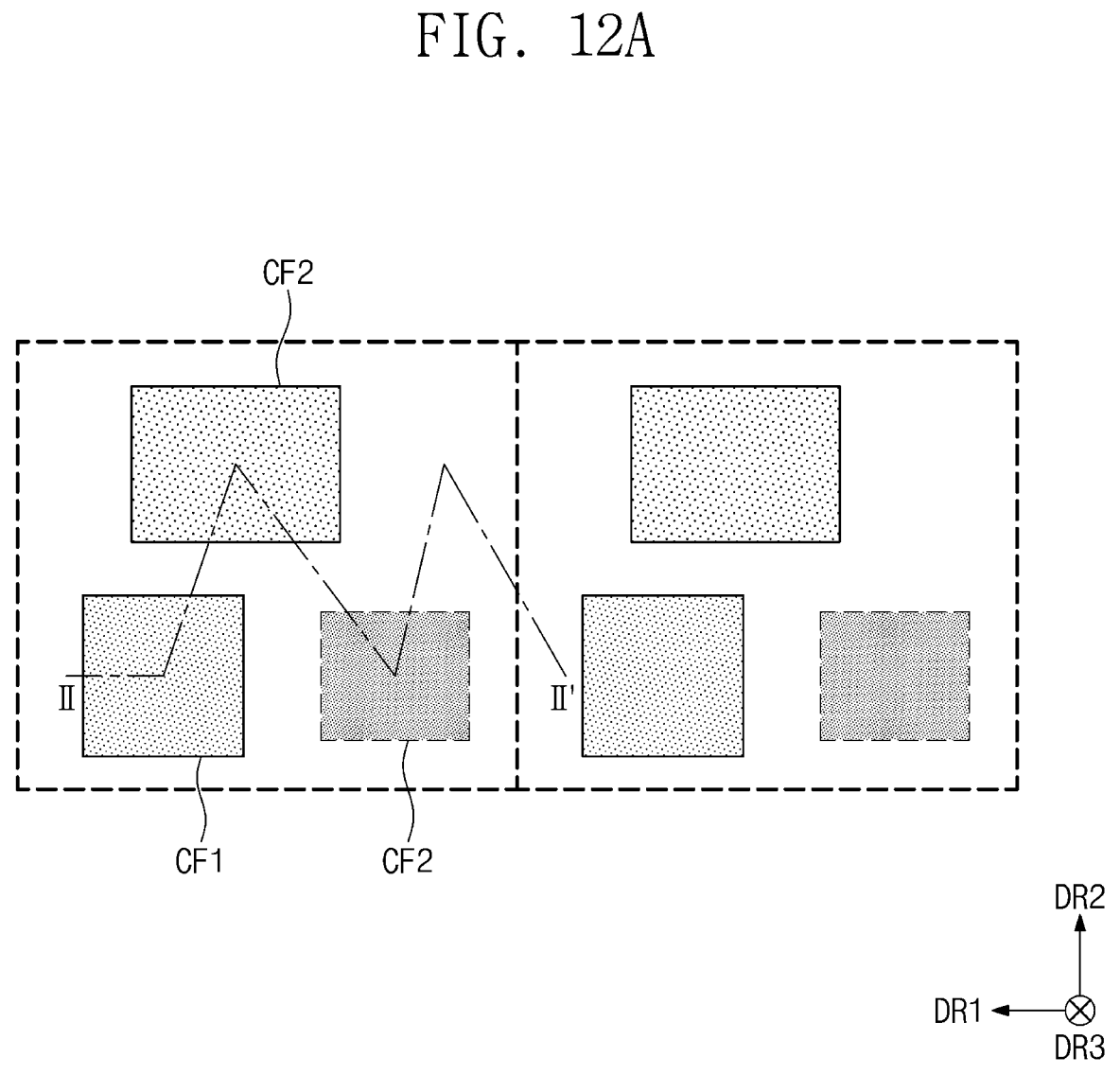
Figure 12B:
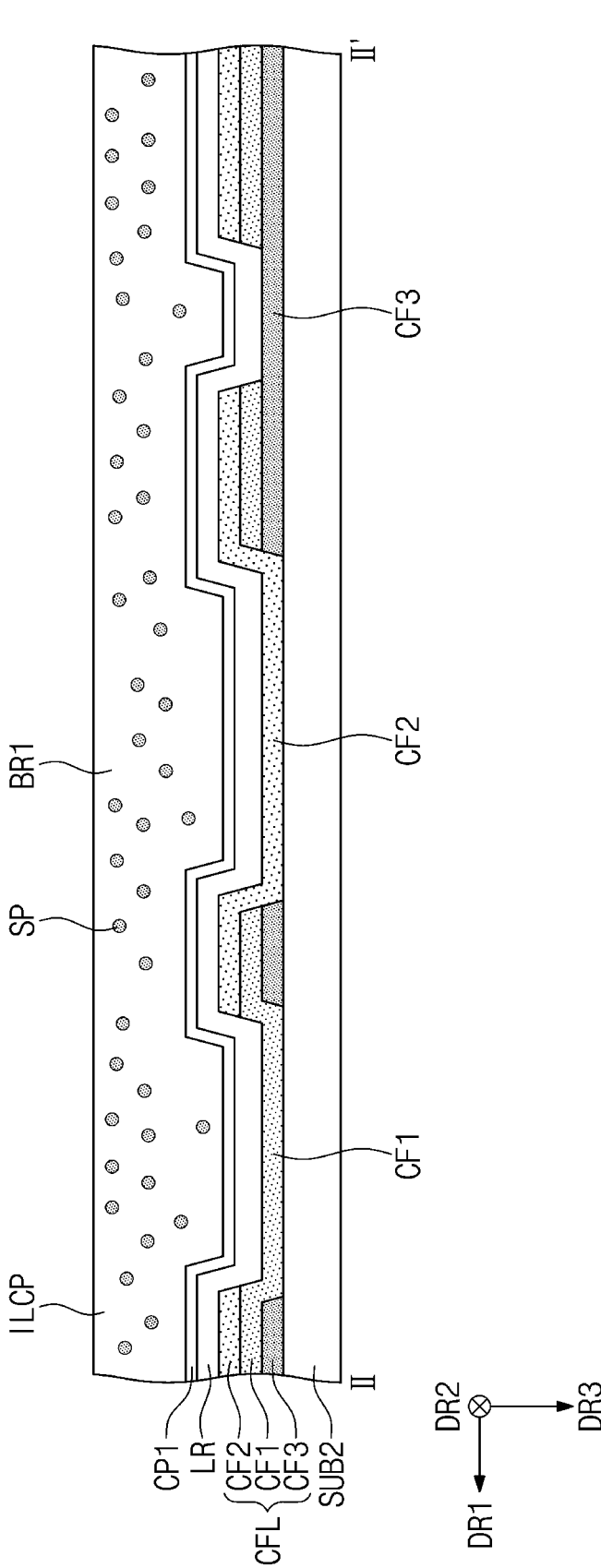
Figure 12C:
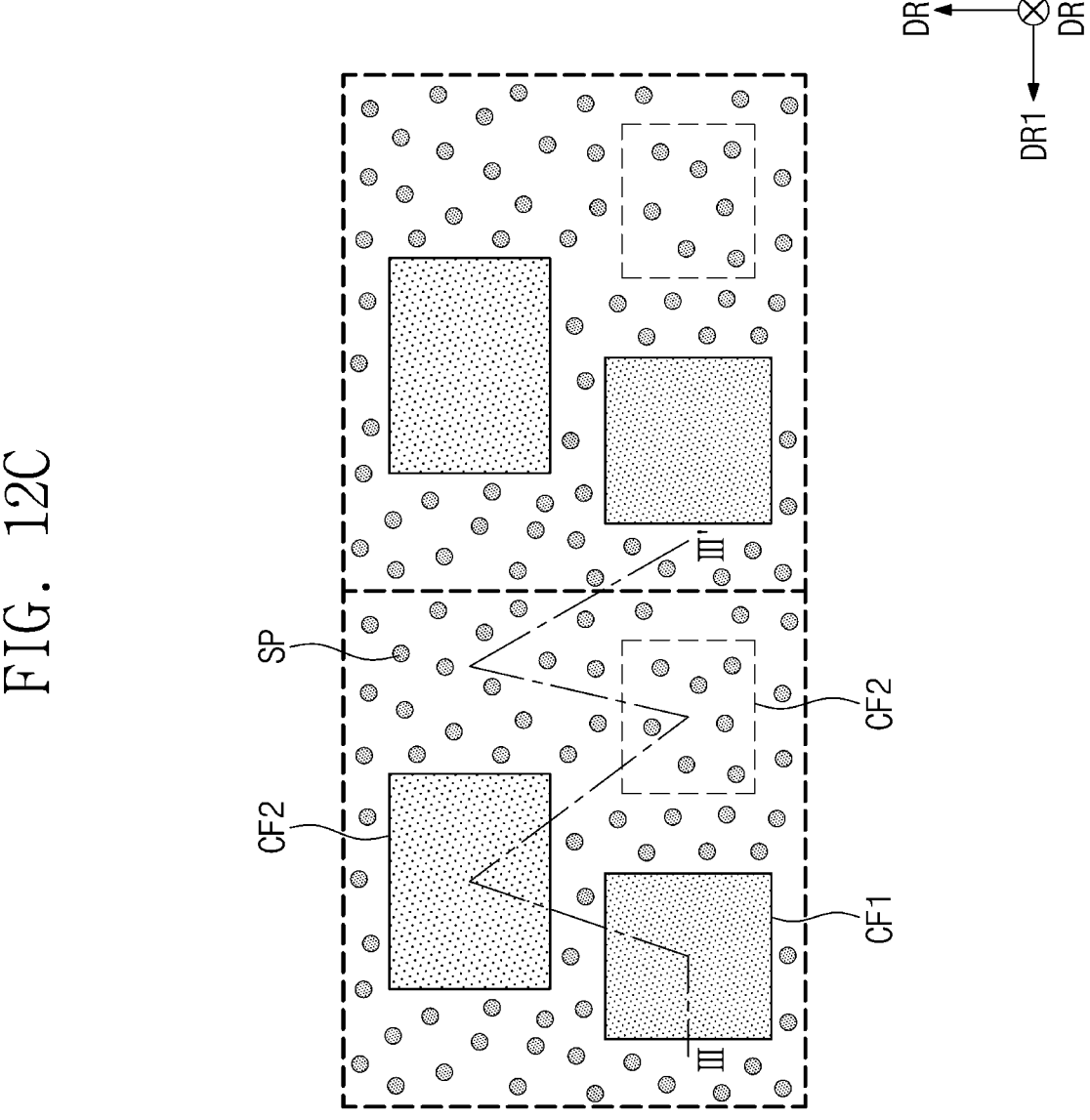
Figure 12D:
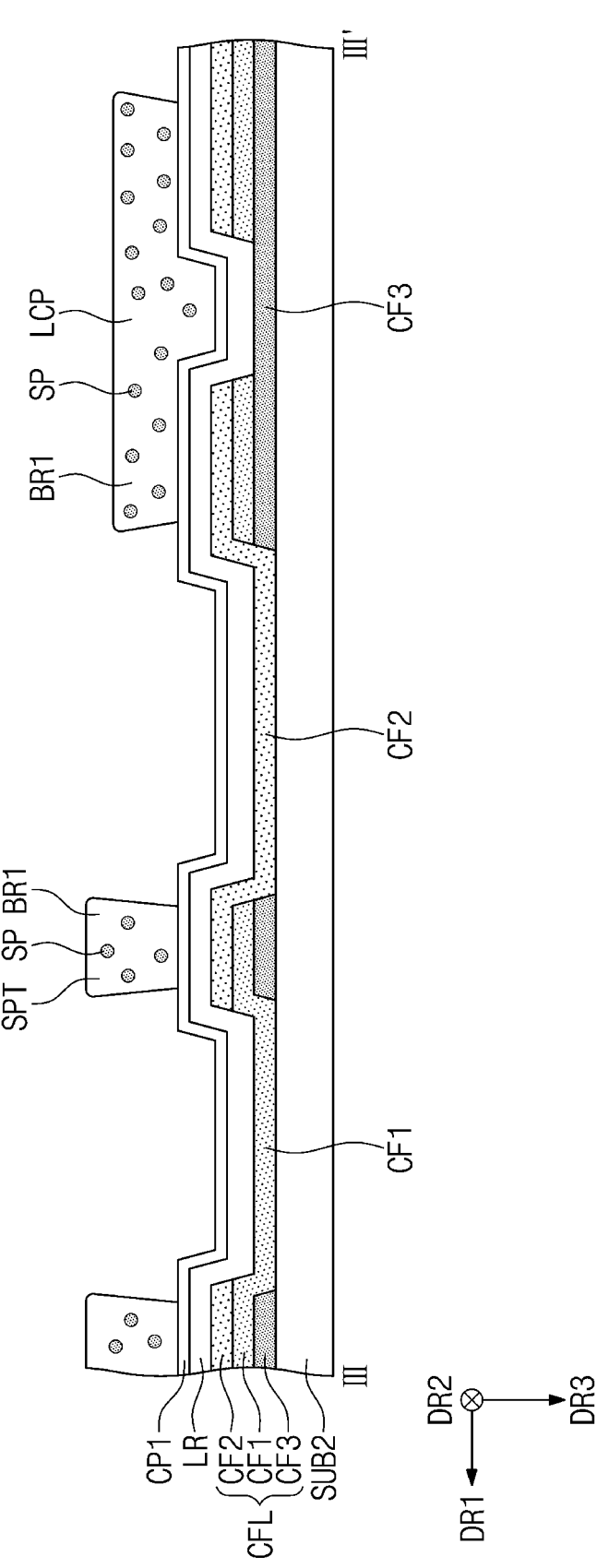
Figure 12E:
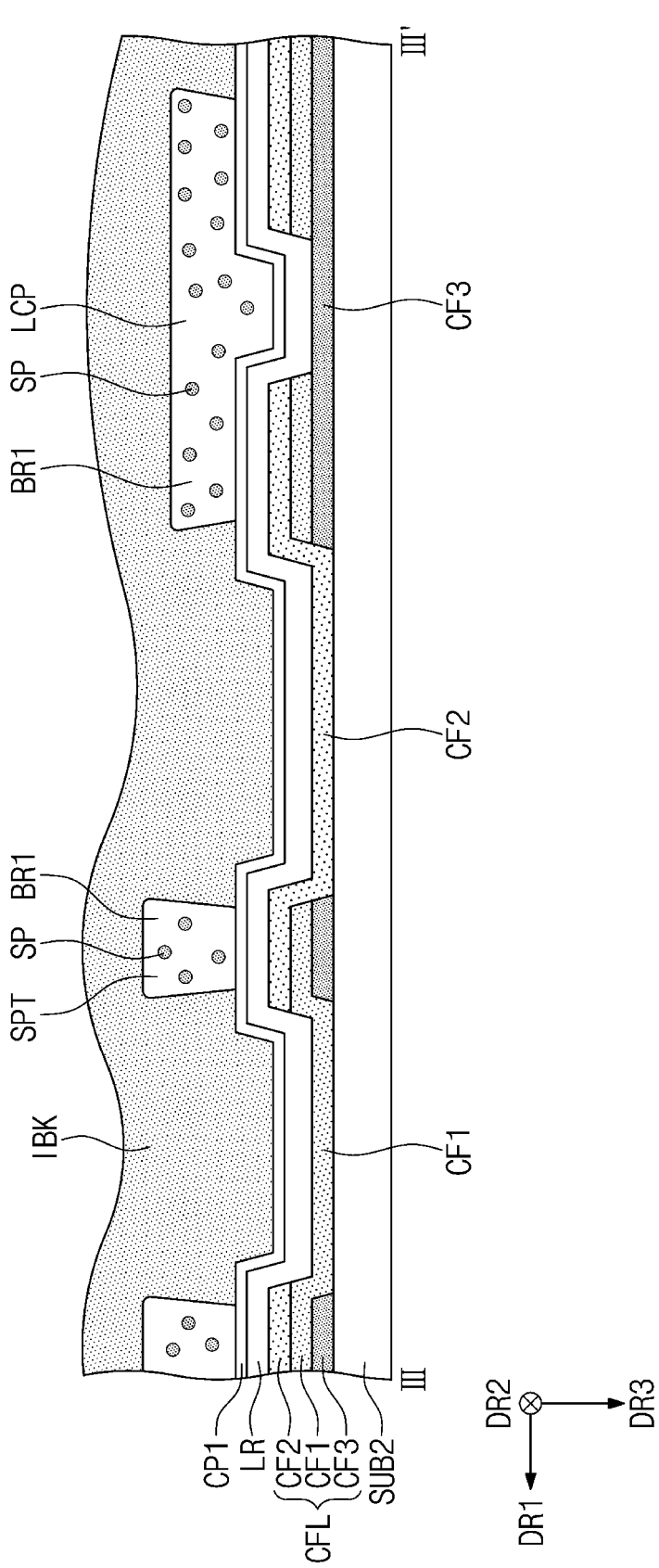
Figure 12F:
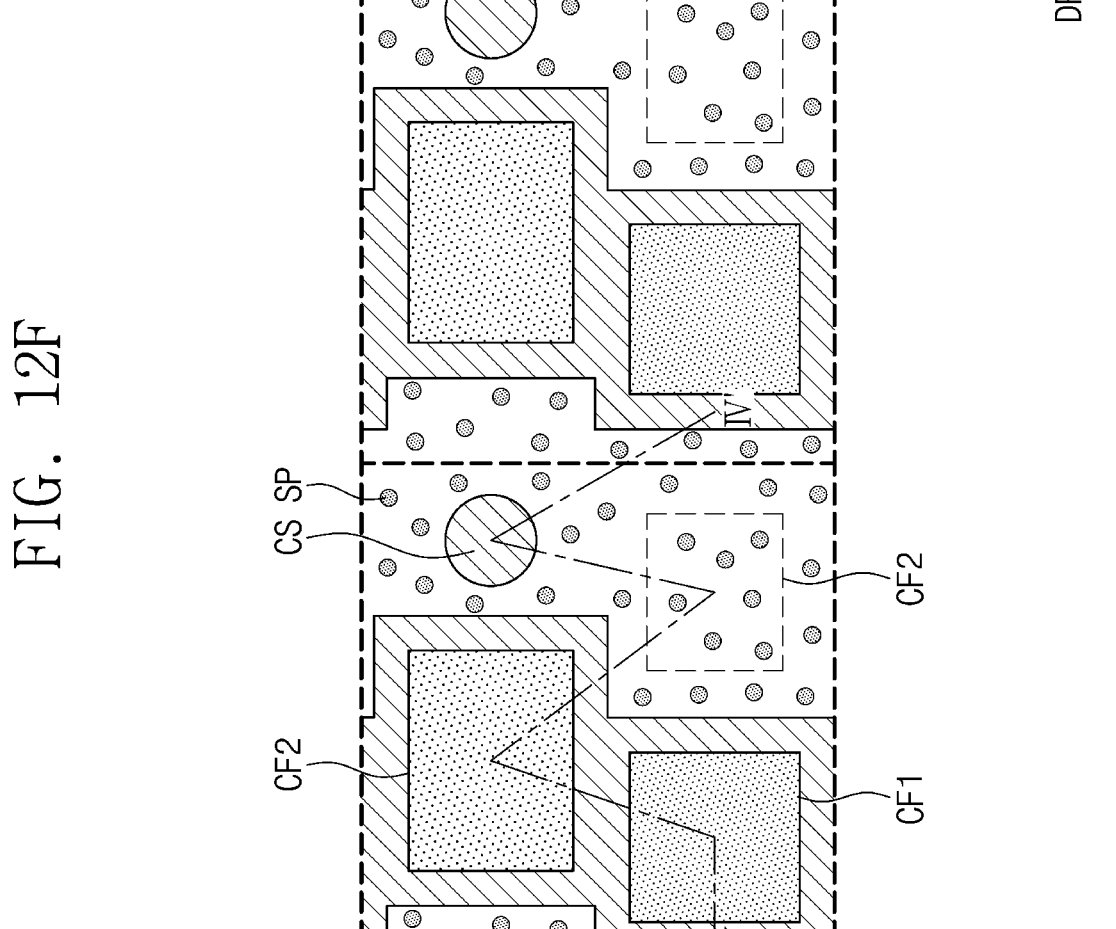
Figure 12G:
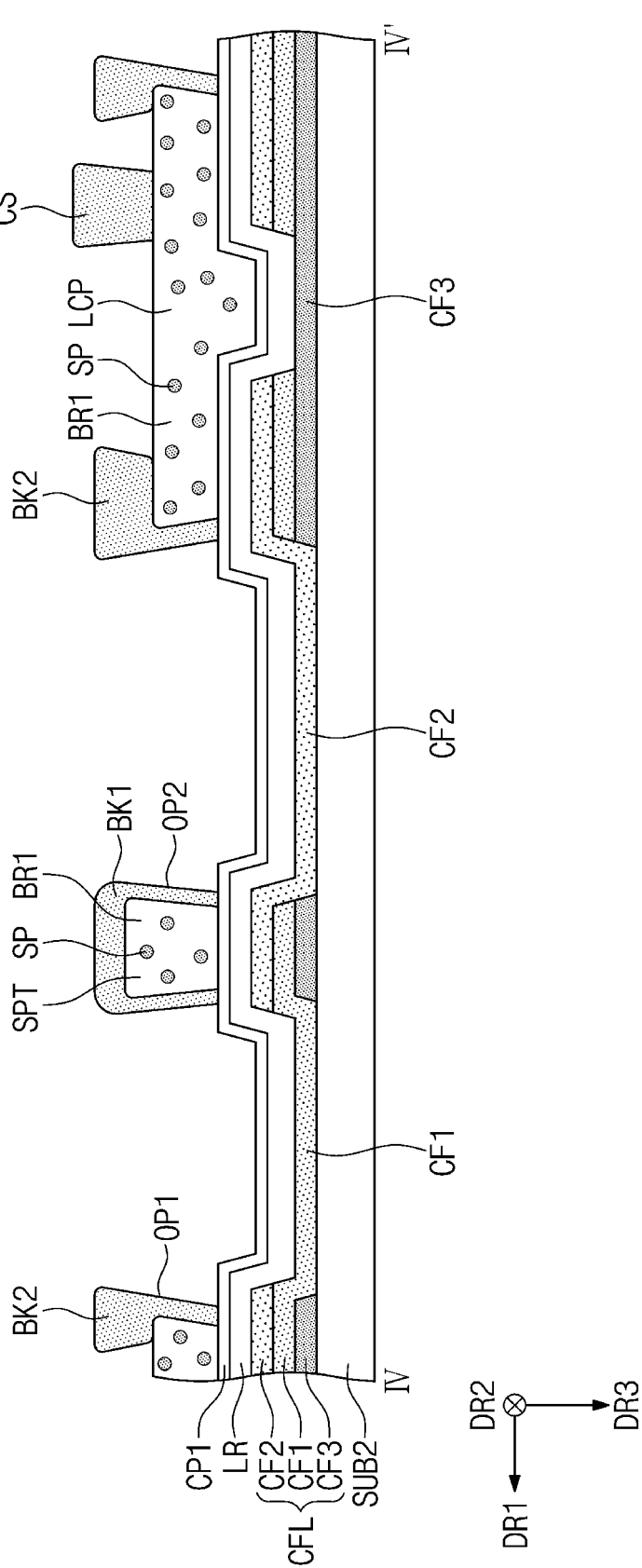

FIG. 12B is a cross-sectional view taken along line II-II' in FIG. 12A, FIG. 12D is a cross-sectional view taken along line III-III' in FIG. 12C, and FIG. 12G is a cross-sectional view taken along line IV-IV' in FIG. 12F.

For convenience of description, FIGS. 12B, 12D, 12E, 12G, and 12H illustrate the light control layer LCL of FIG. 7 symmetrically with respect to a third direction DR3.

An upper substrate SUB2, a color filter layer CFL, a low refractive layer LR, and a first capping layer CP1 of FIGS. 12A to 12I may be the same as the upper substrate SUB2, the color filter layer CFL, the low refractive index layer CP1, the refractive layer LR, and the first capping layer CP1 in FIG. 7, and thus redundant description thereof will be omitted or simplified.

Referring to FIGS. 7 and 12A, a color filter layer CFL may be disposed on the upper substrate SUB2. A first capping layer CP1 and a low refractive index layer LR may be disposed on the color filter layer CFL.

Referring to FIG. 12B, a preliminary light transmission layer ILCP may be provided on the color filter layer CFL. A preliminary light transmission layer ILCP may be provided on an upper surface of the first capping layer CP1. The preliminary transmission layer ILCP may cover the first capping layer CP1. The preliminary light transmission layer ILCP may include a first base resin BR1 and scatterers SP.

Referring to FIGS. 12C and 12D, a portion of the preliminary light transmission layer ILCP may be removed to form a support layer SPT and a light transmission layer LCP.

Although not shown, a photo mask for light blocking may be disposed on the preliminary light transmission layer ILCP. Multiple openings may be defined in the photo mask. The openings may overlap the preliminary light transmission layer ILCP of FIG. 12B that is not removed.

Although not shown, a light source may be disposed on the photo mask. An exposure process may be performed by light emitted from a light source. Light may pass through the openings and be radiated to the preliminary light transmission layer ILCP. Among the preliminary light transmission layer ILCP, a molecular composition or components of the preliminary light transmission layer ILCP irradiated with light may be changed.

Although not shown, an etching process may be performed after the exposure process is performed. The etching process may be a chemical or physical etching process. The chemical etching process may be a process using a developing solution. The physical etching process may be a dry or wet etching process.

Through an etching process, the preliminary transmission layer ILCP excluding the support layer SPT and the light transmission layer LCP may be removed. Through the etching process, the support layer SPT and the light transmission layer LCP may be formed. The support layer SPT and the light transmission layer LCP may be patterned and formed at the same time. The support layer SPT and the light transmission layer LCP may include the same material.

The light transmission layer LCP formed by patterning may have a flat upper surface compared to first and second light conversion layers WCP1 and WCP2 to be described later that is formed using an inkjet process. Light emitted from the third light emitting element OL3 of FIG. 7 may be incident to the light transmission layer LCP. Even in case that an angle of light incident to the light transmission layer LCP is changed, the upper surface of the light transmission layer LCP may be flat, thereby reducing a luminance difference of the first light transmitted through the light transmission layer LCP.

Referring to FIG. 12E, a preliminary bank layer IBK may be provided on the first capping layer CP1, the support layer SPT, and the light transmission layer LCP. The preliminary bank layer IBK may cover the first capping layer CP1, the support layer SPT, and the light transmission layer LCP. The preliminary bank layer IBK may include a black pigment and a water repellent material.

Among the preliminary bank layers IBK, a height of the preliminary bank layer IBK overlapping the support layer SPT and the light transmission layer LCP may be higher than that of the surrounding preliminary bank layers IBK.

Although not shown, a photo mask for light blocking may be disposed on the preliminary bank layer IBK. Multiple openings may be defined in the photo mask. The openings may overlap the first and second bank layers BK1 and BK2 and the spacer CS of FIG. 7.

Although not shown, a light source may be disposed on the photo mask. An exposure process may be performed by light emitted from the light source. Light may pass through the openings and be radiated onto the preliminary bank layer IBK. A molecular composition or components of the preliminary bank layer IBK irradiated with light may be changed.

Although not shown, an etching process may be performed after the exposure process is performed. The etching process may be a chemical or physical etching process. The chemical etching process may be a process using a developing solution. The physical etching process may be a dry or wet etching process.

Referring to FIGS. 12F and 12G, the preliminary bank layer IBK excluding the first and second bank layers BK1 and BK2 and the spacer CS may be removed through an etching process. Through the etching process, the first and second bank layers BK1 and BK2 and the spacer CS may be formed.

The first bank layer BK1 may cover the support layer SPT. The second bank layers BK2 may cover an edge of the light transmission layer LCP. A portion of the light transmission layer LCP may be exposed to the outside from the second bank layers BK2.

Figure 12H:
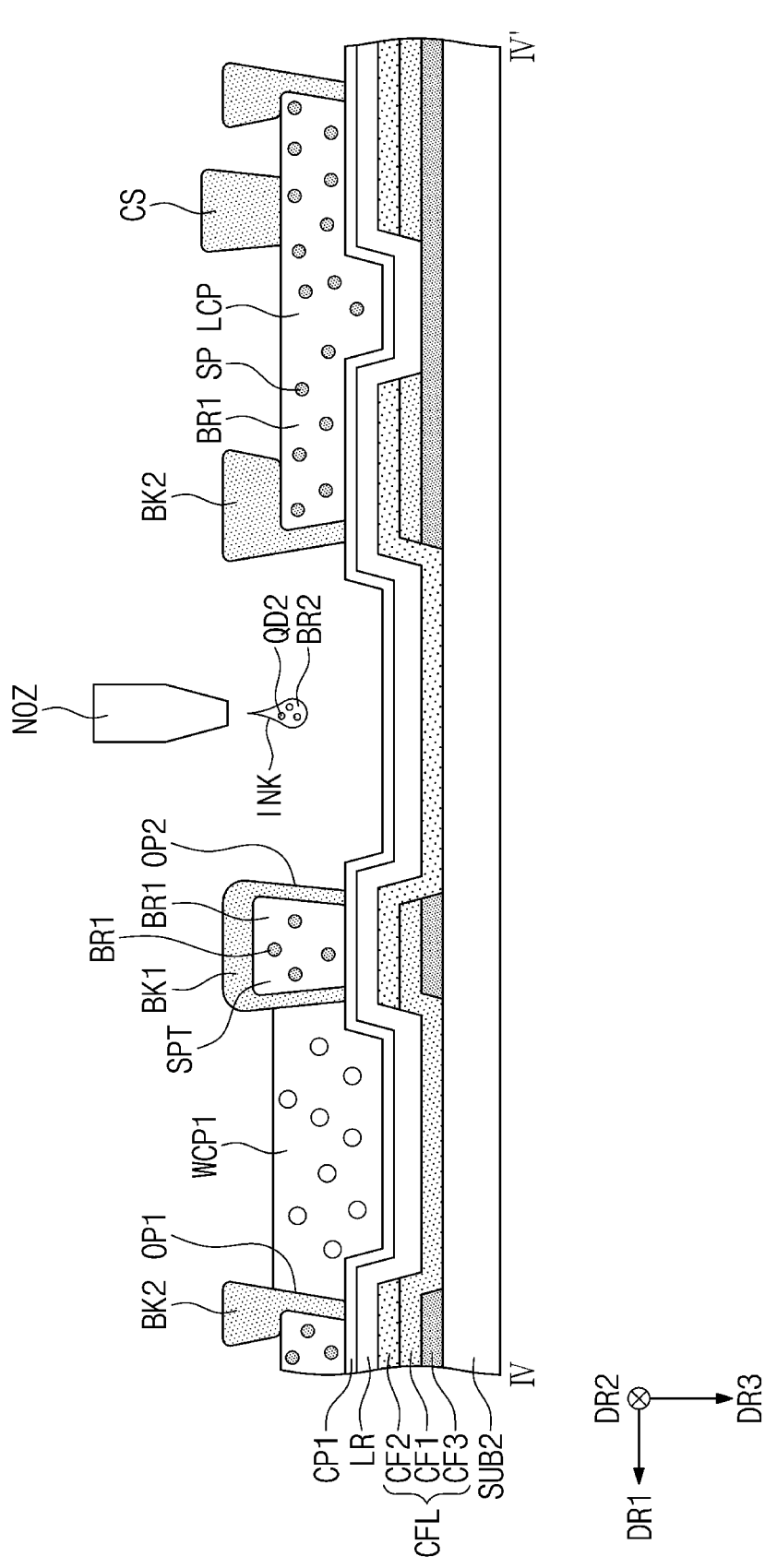
Figure 12I:
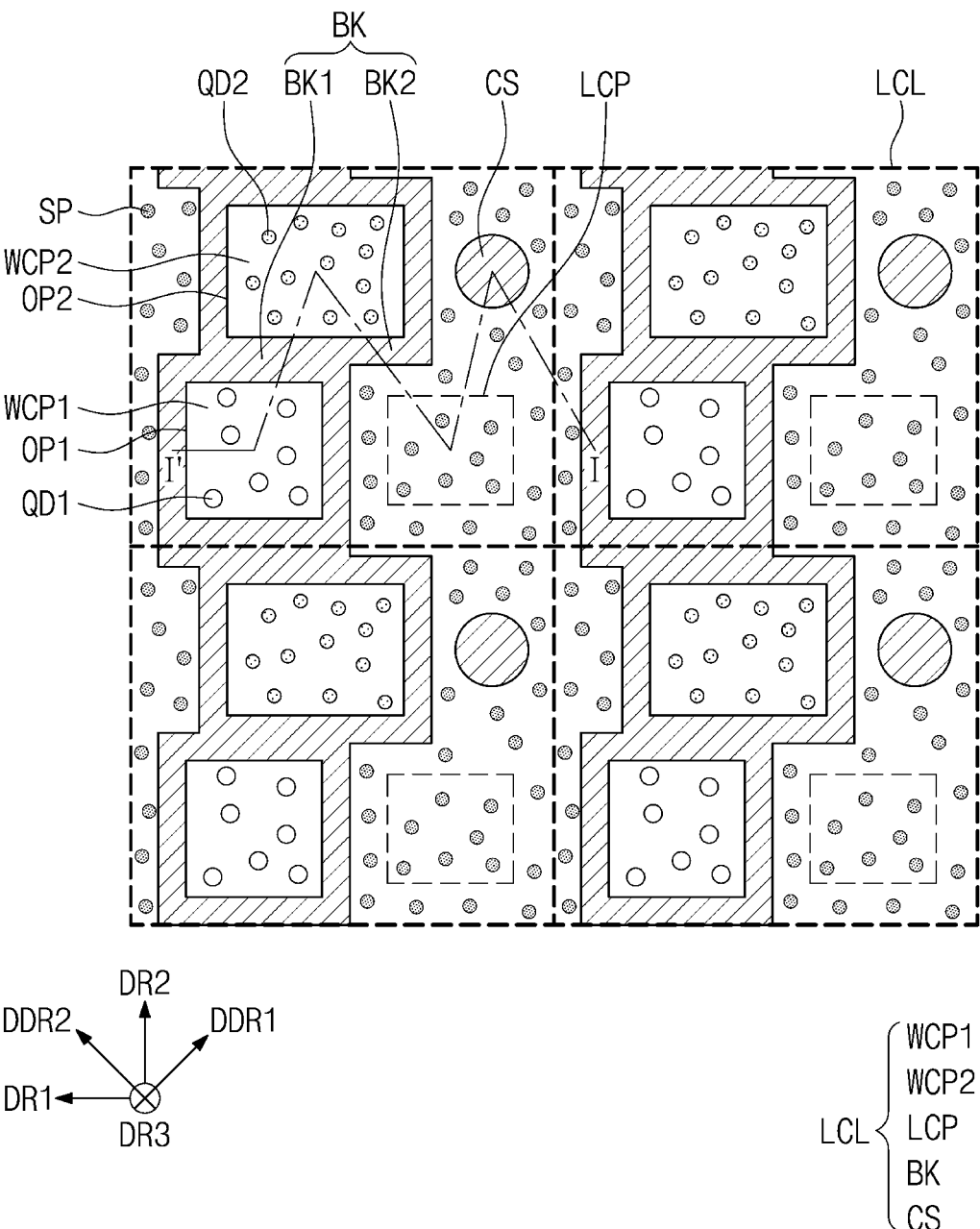

Referring to FIGS. 12H and 12I, a nozzle NOZ may be disposed on the second opening OP2. The nozzle NOZ may eject an ink INK into the second opening OP2. The ink INK may include a composition constituting the second light conversion layer WCP2 of FIG. 7. For example, the ink INK may include a second base resin BR2 in which second quantum dots QD2 are dispersed.

Although not shown, a first light conversion layer WCP1 may also be disposed in the first opening OP1 through the same process as the second light conversion layer WCP2.

Although not shown, in case that the first and second light conversion layers WCP1 and WCP2 are formed, as illustrated in FIG. 7, the color filter layer CFL, the upper substrate SUB2, the light transmission layer LCP, the light conversion layers WCP, the bank layers BK, and the spacer CS may be provided on the display panel DP and may be provided to face the display panel DP.

According to an embodiment of the disclosure, after the bank layers are provided on the substrate, the light conversion layer, and the support layer, the bank layers may be patterned to cover the support layer and the edge of the light transmission layer. The light transmission layer and the support layer may support the bank layers. In case that the bank layers are patterned, the bank layers overlapping the non-light emitting region may not be separated from the substrate. Accordingly, it may be possible to prevent color mixing of the light of different colors by the bank layer, thereby improving the color matching rate.

The spacers that are spaced apart from the bank layers and include the same material as that of the bank layers may be disposed on the light conversion layer. As the spacers are patterned and formed simultaneously with the bank layers, it may be possible to readily adjust the thickness of the light transmission layer and the bank layers. Accordingly, the yield of the light control layer may be increased.

The light conversion layer and the support layer may be simultaneously patterned and formed on the substrate. Accordingly, in case that the light conversion layer is formed by the patterning rather than by using the inkjet process, the upper surface of the light conversion layer may be planarized, thereby reducing the luminance difference.

While embodiments are described above, a person skilled in the art will understand that many modifications and variations are made without departing from the spirit and scope of the disclosure defined in the following claims. Accordingly, the example embodiments of the disclosure should be considered in all respects as illustrative and not restrictive.

What is claimed is:

1. A display device, comprising:
a display panel;
a first light conversion layer, a second light conversion layer, and a light transmission layer that are disposed on the display panel and spaced apart from each other;
a support layer that is disposed between the first light conversion layer and the second light conversion layer; and
a bank layer that is disposed on the display panel to define openings in which the first and second light conversion layers are disposed, and is disposed on the support layer and between the first and second light conversion layers,
wherein the support layer and the light transmission layer include a same material.

2. The display device of claim 1, wherein
the bank layer covers an edge of the light transmission layer, and
the bank layer exposes a portion of the light transmission layer spaced apart from the edge of the light transmission layer.

3. The display device of claim 1, wherein the bank layer includes:
a first bank layer that is disposed on the support layer between the first and second light conversion layers; and
a plurality of second bank layers that are disposed between the first light conversion layer and the light transmission layer and between the second light conversion layer and the light transmission layer, the plurality of second bank layers covering an edge of the light transmission layer.

4. The display device of claim 3, wherein the first bank layer is disposed on the display panel to cover the support layer.

5. The display device of claim 3, wherein
the first bank layer is disposed on an upper surface of the support layer and on a side surface of the support layer facing the first and second light conversion layers, and
another side surface of the support layer on which the first bank layer is not disposed is exposed by the first bank layer.

6. The display device of claim 3, wherein
the support layer includes:
a first support layer; and
a second support layer that is spaced apart from the first support layer,
the first bank layer is disposed between the first support layer and the second support layer and on upper surfaces of the first and second support layers, and
a side surface of the first support layer and a side surface of the second support layer that do not face each other are exposed by the first bank layer.

7. The display device of claim 3, wherein the first bank layer and the plurality of second bank layers have a black color.

8. The display device of claim 3, further comprising:
a spacer that is disposed on the light transmission layer and spaced apart from the plurality of second bank layers.

9. The display device of claim 8, wherein an upper surface of the spacer is disposed at a different height from upper surfaces of the plurality of second bank layers.

10. The display device of claim 9, wherein the upper surface of the spacer is closer to the display panel than the upper surfaces of the plurality of second bank layers.

11. The display device of claim 9, wherein the upper surface of the spacer is further spaced from the display panel than the upper surfaces of the plurality of second bank layers.

12. The display device of claim 8, wherein the spacer has a black color.

13. The display device of claim 8, wherein
the display panel includes:
a plurality of light emitting elements that are disposed in light emitting regions; and
a pixel defining layer that is disposed in a non-light emitting region between the light emitting regions and defines light emitting openings in which the plurality of light emitting elements are disposed overlapping the light emitting regions in a plan view,
the first and second light conversion layers overlap the light emitting regions in a plan view, and
the light transmission layer overlaps the light emitting regions and the non-light emitting region in a plan view.

14. The display device of claim 13, wherein the first bank layer, the plurality of second bank layers, and the spacer overlap the non-light emitting region in a plan view.

15. The display device of claim 3, further comprising:
a first color filter that is disposed on the first light conversion layer;
a second color filter that is disposed on the second light conversion layer; and
a third color filter that is disposed on the light transmission layer.

16. The display device of claim 15, wherein the first, second, and third color filters extend onto the first bank layer and the plurality of second bank layers and overlap each other in a plan view.

17. A method of manufacturing a display device, the method comprising:

providing a light transmission layer and a support layer spaced apart from the light transmission layer on a substrate;

providing a bank layer on the support layer and on an edge of the light transmission layer;

providing a first light conversion layer and a second light conversion layer in openings defined by the bank layer around the support layer and the light transmission layer; and providing the first and second light conversion layers and the light transmission layer on a display panel to face the display panel, wherein the support layer and the light transmitting layer include a same material.

18. The method of claim 17, wherein the light transmission layer and the support layer are simultaneously patterned, and the light transmission layer and the support layer are formed of a same material.

19. The method of claim 17, wherein the providing of the first and second light conversion layers includes forming the first and second light conversion layers using an inkjet process.

20. The method of claim 17, wherein the bank layer includes:

a first bank layer that is disposed on the support layer between the first and second light conversion layers; and a plurality of second bank layers that are disposed between the first light conversion layer and the light transmission layer and between the second light conversion layer and the light transmission layer and that cover an edge of the light transmission layer, and the first bank layer is disposed on the display panel to cover upper and side surfaces of the support layer.

21. A display device, comprising:

a display panel;

a first light conversion layer, a second light conversion layer, and a light transmission layer that are disposed on the display panel and spaced apart from each other;

a support layer that is disposed between the first light conversion layer and the second light conversion layer;

a bank layer that is disposed on the light transmission layer, covers an edge of the light transmission layer and the support layer, and defines openings in which the first and second light conversion layers are disposed; and a spacer that is disposed on the light transmission layer and spaced apart from the bank layer, wherein the support layer and the light transmission layer include a same material, the bank layer and the spacer include a same material, and the bank layer and the spacer do not overlap each other in a plan view.

* * * * *